US012749871B2

(12) United States Patent
Watanabe et al.

(10) Patent No.: US 12,749,871 B2
(45) Date of Patent: Sep. 29, 2026

(54) VERTICAL CAVITY SURFACE EMITTING LASER ELEMENT AND METHOD OF PRODUCING VERTICAL CAVITY SURFACE EMITTING LASER ELEMENT

(71) Applicant: SONY GROUP CORPORATION, Tokyo (JP)

(72) Inventors: Tomomasa Watanabe, Tokyo (JP); Mikihiro Yokozeki, Tokyo (JP); Hiroshi Nakajima, Tokyo (JP); Daiji Kasahara, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 758 days.

(21) Appl. No.: 18/042,228

(22) PCT Filed: Aug. 17, 2021

(86) PCT No.: PCT/JP2021/030039

§ 371 (c)(1),
(2) Date: Feb. 20, 2023

(87) PCT Pub. No.: WO2022/044886

PCT Pub. Date: Mar. 3, 2022

(65) Prior Publication Data

US 2023/0299559 A1 Sep. 21, 2023

(30) Foreign Application Priority Data

Aug. 26, 2020 (JP) ................................ 2020-143035

(51) Int. Cl.
*H01S 5/183* (2006.01)
*H01S 5/30* (2006.01)

(52) U.S. Cl.
CPC ...... *H01S 5/18327* (2013.01); *H01S 5/18361* (2013.01); *H01S 5/3095* (2013.01)

(58) Field of Classification Search
CPC .................................................... H01S 5/3095
See application file for complete search history.

(56) References Cited

U.S. PATENT DOCUMENTS

2005/0105576 A1* 5/2005 Kim ....................... B82Y 20/00 372/50.1
2006/0227835 A1 10/2006 Ueki
2020/0321754 A1* 10/2020 Hegblom ............ H01S 5/18341

FOREIGN PATENT DOCUMENTS

CN 111211488 A * 5/2020 ......... H01S 5/18386
JP 2000-196190 A 7/2000
(Continued)

OTHER PUBLICATIONS

English Translation of Jikutani (Year: 2005).*
(Continued)

*Primary Examiner* — Minsun O Harvey
(74) *Attorney, Agent, or Firm* — CHIP LAW GROUP

(57) ABSTRACT

A Provided is a vertical cavity surface emitting laser element that includes a first DBR, a second BR, an active layer, and a tunnel junction layer. The first DBR and the second DBR reflects light of the wavelength. The active layer is disposed between the first DBR and the second DBR. The tunnel junction layer is disposed between the first DBR and the active layer and forms a tunnel junction. Respective layers between the first DBR and the second DBR have an inner peripheral region that is on an inner peripheral side as viewed from a direction perpendicular to a layer surface, and an outer peripheral region surrounding the inner peripheral region, ions being implanted into the outer peripheral region of the tunnel junction layer, the outer peripheral region having a lower carrier concentration and a larger electric resistance than the inner peripheral region of the tunnel junction layer.

16 Claims, 33 Drawing Sheets

(56) References Cited

FOREIGN PATENT DOCUMENTS

| | | | | |
|---|---|---|---|---|
| JP | 2005-039102 | A | | 2/2005 |
| JP | 2005044964 | A | * | 2/2005 |
| JP | 2005183871 | A | * | 7/2005 |
| JP | 2006-245473 | A | | 9/2006 |
| JP | 2008-147531 | A | | 6/2008 |
| JP | 2009-206182 | A | | 9/2009 |
| JP | 2009-218281 | A | | 9/2009 |
| JP | 2019-212742 | A | | 12/2019 |
| WO | 2008/114707 | A1 | | 9/2008 |

OTHER PUBLICATIONS

English Translation of Inoue (Year: 2005).*
English Translation of Shen (Year: 2020).*
Lee Seunggeun et al: "GaN-Based vertical-cavity surface-emitting lasers with tunnel junction contacts grown by metal-organic chemical vapor deposition", Applied Physics Express, vol. 11, May 24, 2018 (May 24, 2018), p. 062703. XP055964241.
International Search Report and Written Opinion of PCT Application No. PCT/JP2021/030039, issued on Oct. 19, 2021, 11 pages of ISRWO.

* cited by examiner

VERTICAL CAVITY SURFACE EMITTING LASER ELEMENT AND METHOD OF PRODUCING VERTICAL CAVITY SURFACE EMITTING LASER ELEMENT

CROSS REFERENCE TO RELATED APPLICATIONS

This application is a U.S. National Phase of International Patent Application No. PCT/JP2021/030039 filed on Aug. 17, 2021, which claims priority benefit of Japanese Patent Application No. JP 2020-143035 filed in the Japan Patent Office on Aug. 26, 2020. Each of the above-referenced applications is hereby incorporated herein by reference in its entirety.

TECHNICAL FIELD

The present technology relates to a vertical cavity surface emitting laser element that emits a laser beam in a direction perpendicular to a layer surface and a method of producing the vertical cavity surface emitting laser element.

BACKGROUND ART

A VCSEL (Vertical Cavity Surface Emitting Laser) device has a structure in which an active layer is sandwiched between a pair of distributed Bragg reflectors (DBRs). A current confinement structure is provided in the vicinity of the active layer and a current is concentrated in a partial region in the active region due to the current confinement structure, generating spontaneous emission light. The DBR includes a plurality of layers obtained by alternately stacking a low-refractive index layer and a high-refractive index layer and causes laser oscillation by reflecting light of a predetermined wavelength among the spontaneous emission light toward the active layer.

Here, in an InP VCSEL device including an active layer formed of an InP material, an ion implant is used as a current confinement structure (e.g., Patent Literature 1). Patent Literature 1 discloses a surface emitting laser device in which protons are implanted into an outer peripheral region of a tunnel junction layer formed of an AlGaNAs mixed crystal to form a current confinement structure.

CITATION LIST

Patent Literature

Patent Literature 1: Japanese Patent Application Laid-open No. 2009-218281

DISCLOSURE OF INVENTION

Technical Problem

However, in the configuration shown in Patent Literature 1, although a current confinement effect can be achieved, loss due to light absorption occurs in a region into which protons are implanted, which is disadvantageous for achieving a high output and is insufficient for practical use. Further, a buried tunnel junction structure is also known as a current confinement structure of the InP VCSEL device. The buried tunnel junction structure requires a buried growth process of tunnel junction and an increase in the production cost due to regrowth is inevitable.

In view of the circumstances as described above, it is an object of the present technology to provide a vertical cavity surface emitting laser element that has excellent producibility and is suitable for high output, and a method of producing the vertical cavity surface emitting laser element.

Solution to Problem

In order to achieve the above-mentioned object, a vertical cavity surface emitting laser element according to an embodiment of the present technology includes: a first DBR; a second DBR; an active layer; and a tunnel junction layer.

The first DBR reflects light of a specific wavelength.

The second DBR reflects light of the wavelength.

The active layer is disposed between the first DBR and the second DBR.

The tunnel junction layer is disposed between the first DBR and the active layer and forms a tunnel junction.

Respective layers between the first DBR and the second DBR have an inner peripheral region that is on an inner peripheral side as viewed from a direction perpendicular to a layer surface, and an outer peripheral region surrounding the inner peripheral region, ions being implanted into the outer peripheral region of the tunnel junction layer, the outer peripheral region having a lower carrier concentration and a larger electric resistance than the inner peripheral region of the tunnel junction layer.

In accordance with this configuration, by implanting ions into the outer peripheral region of the tunnel junction layer, it is possible to reduce the carrier concentration in the outer peripheral region and eliminate the tunnel junction in the outer peripheral region. As a result, the outer peripheral region has an electric resistance larger than that of the inner peripheral region, and a current confinement structure is formed by the tunnel junction layer. Since a current confinement structure can be formed by implanting ions, this VCSEL device has excellent producibility. Further, since the outer peripheral region of the tunnel junction layer is not insulated by crystal breakage, the light absorption in the outer peripheral region is small and this VCSEL device is suitable for high output.

A bandgap of the outer peripheral region of the tunnel junction layer may be larger than a bandgap of the inner peripheral region of the tunnel junction layer.

A refractive index of the outer peripheral region of the tunnel junction layer may be smaller than a refractive index of the inner peripheral region of the tunnel junction layer.

The ions may be O ions.

The tunnel junction layer may be formed of a substance containing at least one layer of Al.

The outer peripheral region of the tunnel junction layer may contain an Al oxide.

The vertical cavity surface emitting laser element may further include:

a first intermediate layer that is disposed between the tunnel junction layer and the active layer; and a second intermediate layer that is disposed between the second DBR and the active layer, wherein the ions may be O ions, and the outer peripheral region of at least one of the active layer, the first intermediate layer, or the second intermediate layer may contain an Al oxide.

The outer peripheral region of the first intermediate layer may contain an Al oxide, and the outer peripheral region of each of the active layer and the second intermediate layer may contain no Al oxide.

The outer peripheral region of each of the first intermediate layer, the active layer, and the second intermediate layer may contain an Al oxide.

The outer peripheral region of the active layer may contain an Al oxide, and the outer peripheral region of each of the first intermediate layer and the second intermediate layer may contain no Al oxide.

The inner peripheral region of the tunnel junction layer may be formed by stacking a first layer formed of $p^+$-AlInAs and a second layer formed of $n^+$-AlInAs, and the outer peripheral region of the tunnel junction layer may be formed of an AlInAs oxide.

The inner peripheral region of the tunnel junction layer may be formed by stacking a first layer formed of $p^+$-AlGaAs and a second layer formed of $n^+$-AlGaAs, and the outer peripheral region of the tunnel junction layer may be formed of an AlGaAs oxide.

In order to achieve the above-mentioned object, a method of producing a vertical cavity surface emitting laser element according to an embodiment of the present technology includes:

forming a stacked body that includes a first DBR that reflects light of a specific wavelength, a second DBR that reflects light of the wavelength, an active layer that is disposed between the first DBR and the second DBR, and a tunnel junction layer that is disposed between the first DBR and the active layer and forms a tunnel junction, respective layers between the first DBR and the second DBR having an inner peripheral region that is on an inner peripheral side as viewed from a direction perpendicular to a layer surface, and an outer peripheral region surrounding the inner peripheral region; and implanting ions into the outer peripheral region of the tunnel junction layer to make a carrier concentration of the outer peripheral region of the tunnel junction layer lower than a carrier concentration of the inner peripheral region of the tunnel junction layer and make an electric resistance of the outer peripheral region of the tunnel junction layer larger than an electric resistance of the inner peripheral region of the tunnel junction layer.

The tunnel junction layer may be formed of a substance containing Al, and the step of implanting ions into the outer peripheral region of the tunnel junction layer may include implanting O ions into the outer peripheral region of the tunnel junction layer.

The step of implanting ions into the outer peripheral region of the tunnel junction layer may further include generating an Al oxide in the outer peripheral region of the tunnel junction layer by implanting O ions.

The stacked body may further include a first intermediate layer that is disposed between the tunnel junction layer and the active layer, and a second intermediate layer that is disposed between the second DBR and the active layer, and the step of implanting ions into the outer peripheral region of the tunnel junction layer further may include implanting O ions into the outer peripheral region of at least one of the active layer, the first intermediate layer, or the second intermediate layer.

The method of producing a vertical cavity surface emitting laser element may further include an annealing step of repairing crystal defects caused by the ion implantation and promoting generation of an Al oxide.

MODE(S) FOR CARRYING OUT THE INVENTION

A VCSEL (Vertical Cavity Surface Emitting Laser) device according to an embodiment of the present technology will be described.

[Structure of VCSEL Device]

Figure 1:
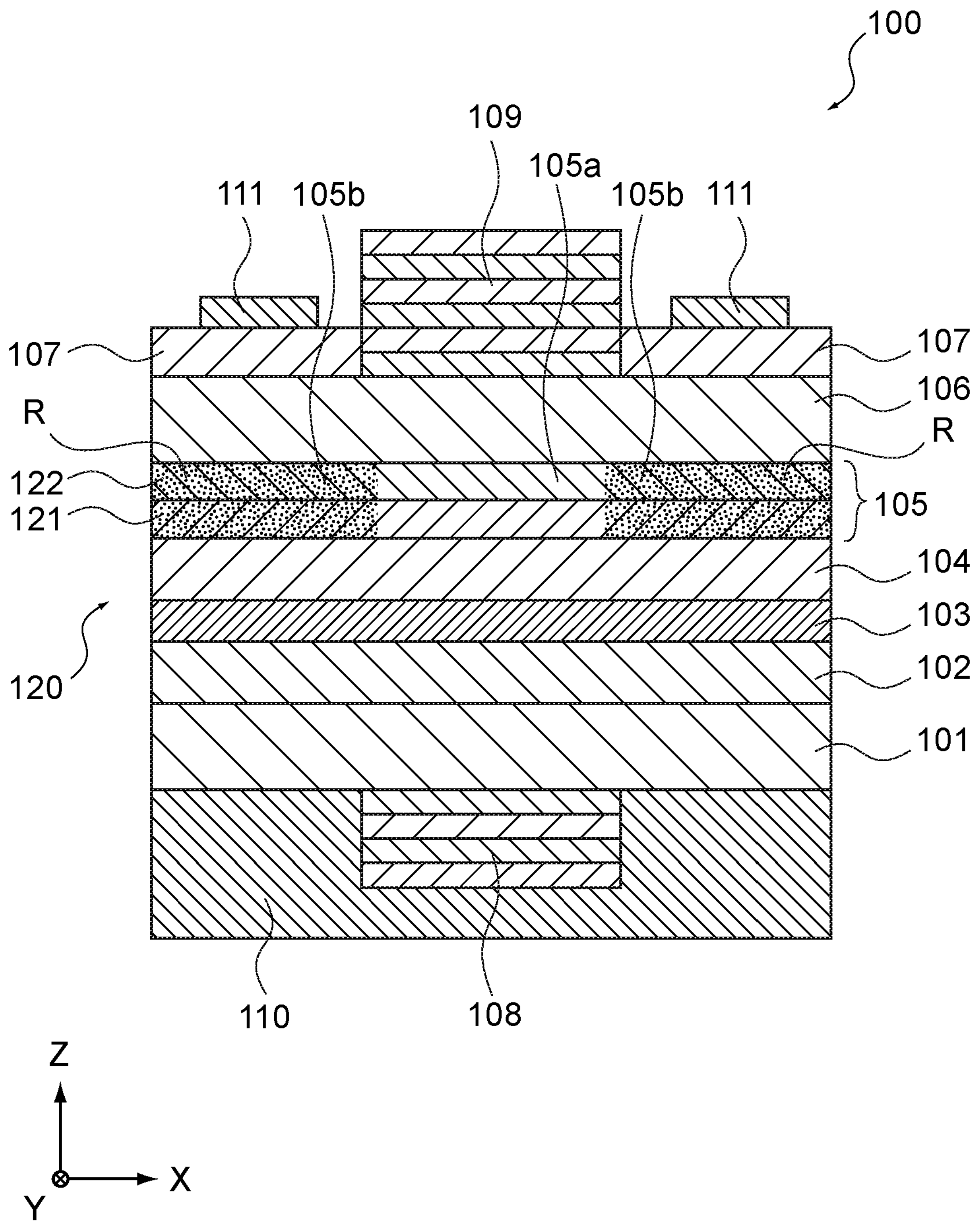
FIG. 1 is a cross-sectional view of a VCSEL device according to an embodiment of the present technology.

FIG. 1 is a cross-sectional view of a VCSEL device 100 according to this embodiment. As shown in the figure, the VCSEL device 100 includes a lower spacer layer 101, a lower intermediate layer 102, an active layer 103, an upper intermediate layer 104, a tunnel junction layer 105, an upper spacer layer 106, a contact layer 107, a lower DBR 108, an upper DBR 109, a lower electrode 110, and an upper electrode 111.

Figure 2:
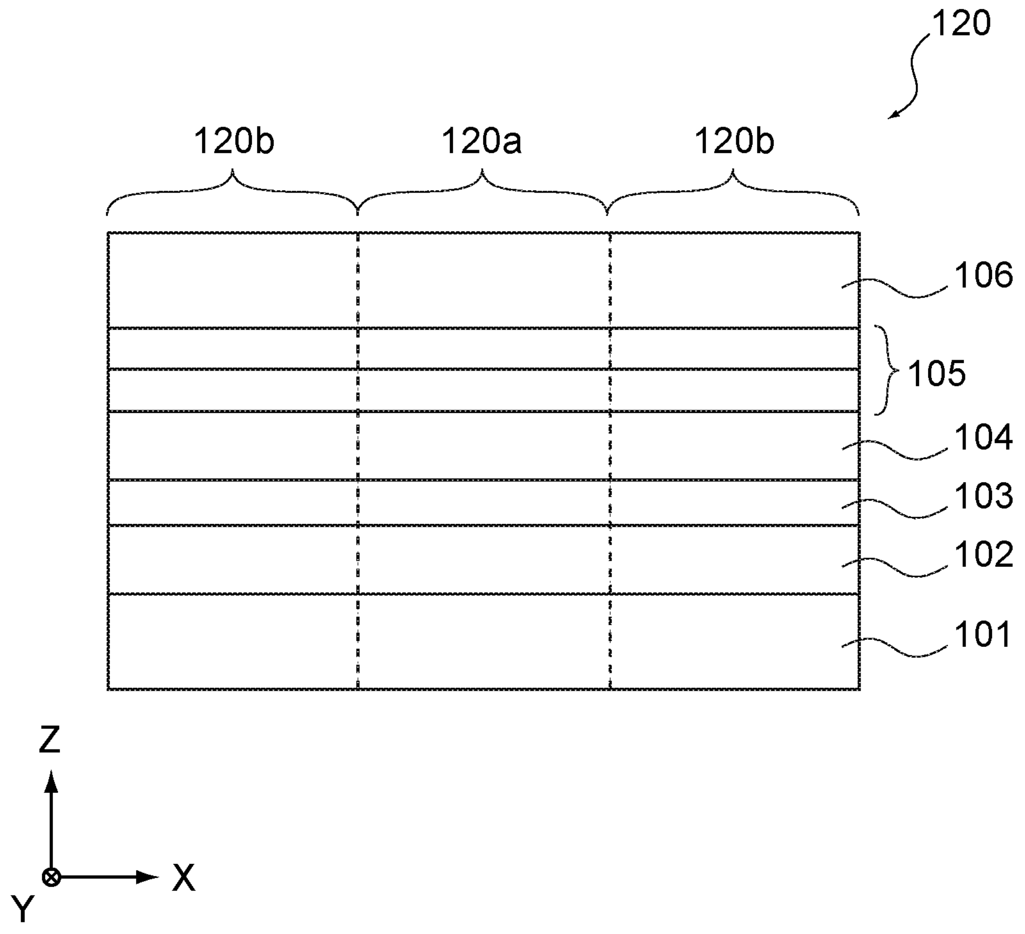
FIG. 2 is a schematic diagram of a stacked body included in the VCSEL device.

Of the configuration of the VCSEL device 100, layers between the lower DBR 108 and the upper DBR 109, i.e., a stacked body of the lower spacer layer 101, the lower intermediate layer 102, the active layer 103, the upper intermediate layer 104, the tunnel junction layer 105, and the upper spacer layer 106 is referred to as a stacked body 120. FIG. 2 is a schematic diagram of the stacked body 120. As shown in the figure, the layer surface direction of the respective layers of the stacked body 120 is defined as an X-Y direction and a direction perpendicular to the layer surface direction is defined as a Z direction.

Figure 3:
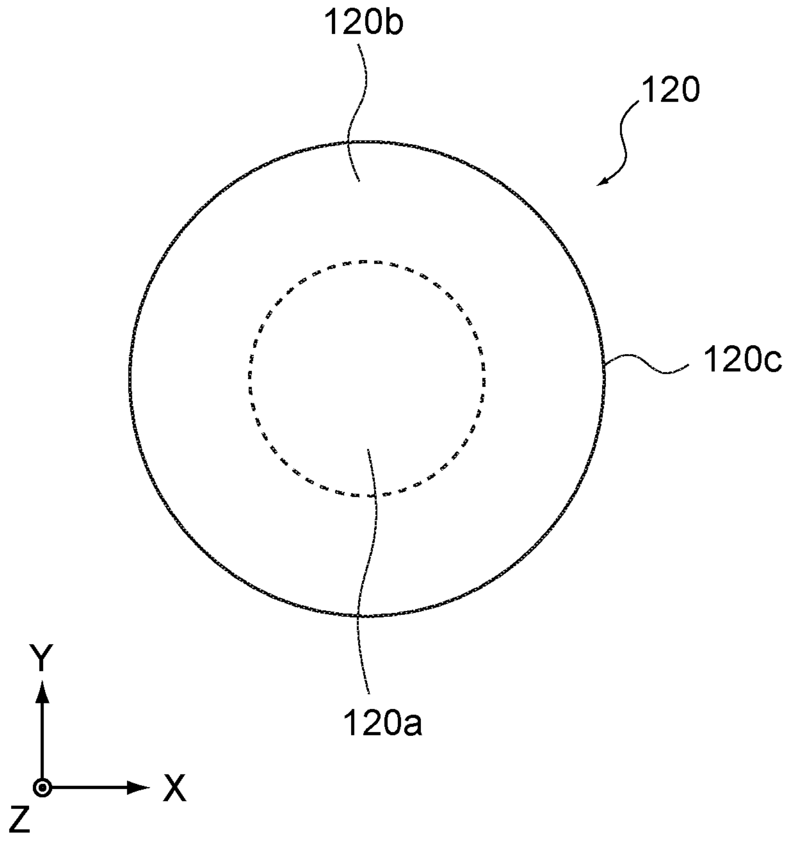
FIG. 3 is a plan view of the stacked body included in the VCSEL device.

FIG. 3 is a diagram of the stacked body 120 as viewed from the Z direction. As shown in the figure, the stacked body 120 includes an inner peripheral region 120*a* and an outer peripheral region 120*b* as viewed from the Z direction. When the circumferential surface of the stacked body 120 parallel to the Z direction is referred to as a circumferential surface 120*c*, the inner peripheral region 120*a* is a region on the inner peripheral side as viewed from the Z direction and is a region spaced apart from the circumferential surface 120*c*. The outer peripheral region 120*b* is a region between the inner peripheral region 120*a* and the circumferential surface 120*c* and is a region surrounding the inner peripheral region 120*a*.

Figure 4:
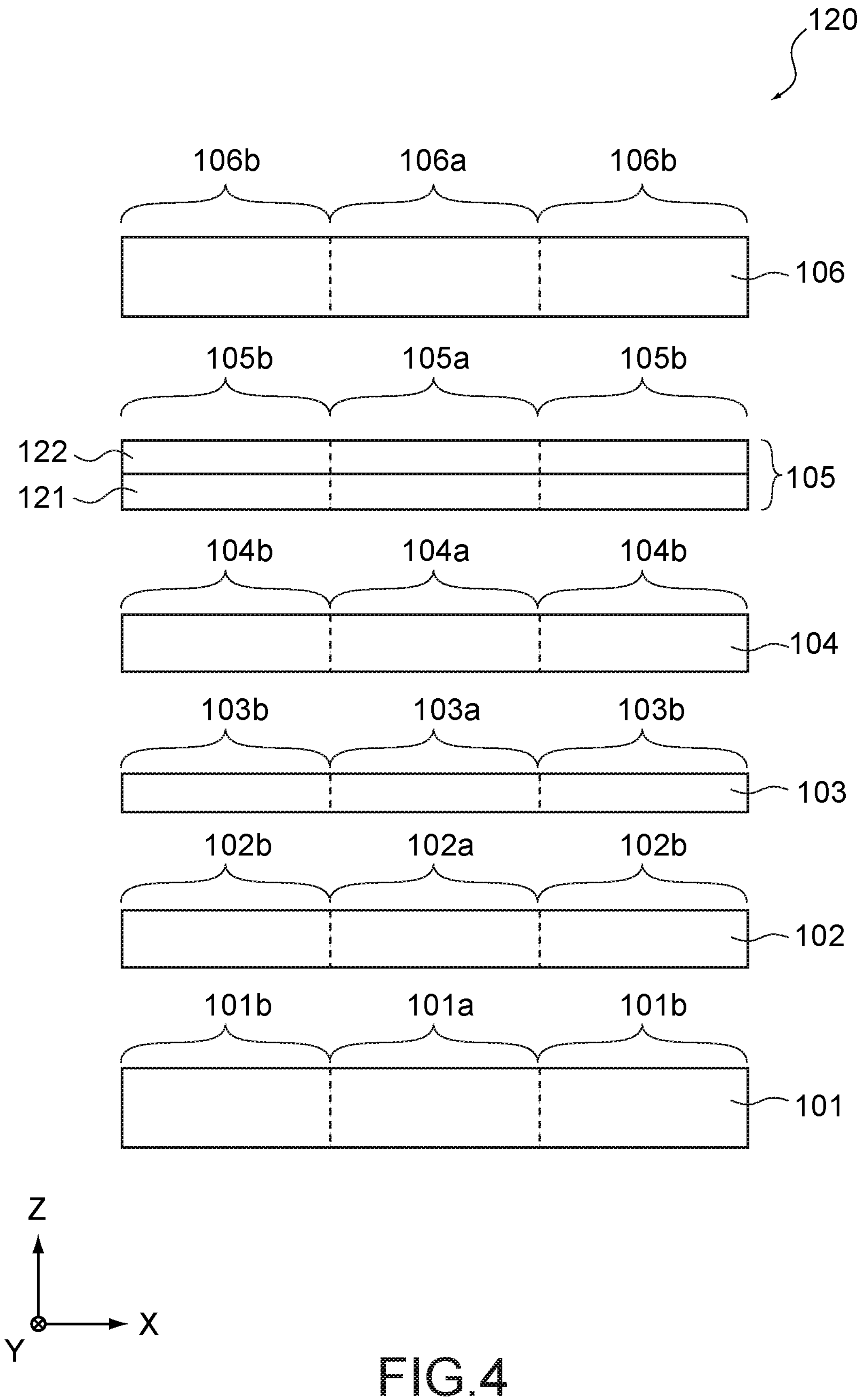
FIG. 4 is a schematic diagram separately showing respective layers of the stacked body included in the VCSEL device.

FIG. 4 is a schematic diagram separately showing the respective layers of the stacked body 120. As shown in the figure, a region included in the inner peripheral region 120*a* and a region included in the outer peripheral region 121*b* in the lower spacer layer 101 are respectively referred to as an inner peripheral region 101*a* and an outer peripheral region 101*b*. Similarly, the respective layers have an inner peripheral region and an outer peripheral region.

That is, the lower intermediate layer 102 has an inner peripheral region 102*a* and an outer peripheral region 102*b*, and the active layer 103 has an inner peripheral region 103*a* and an outer peripheral region 103*b*. The upper intermediate layer 104 has an inner peripheral region 104*a* and an outer peripheral region 104*b*, and the tunnel junction layer 105 has an inner peripheral region 105*a* and an outer peripheral region 105*b*. The upper spacer layer 106 has an inner peripheral region 106*a* and an outer peripheral region 106*b*.

Hereinafter, each configuration of the VCSEL device 100 will be described with reference to FIG. 1. The lower spacer layer 101 is a layer for adjusting the interval between the lower DBR 108 and the upper DBR 109. The lower spacer layer 101 is formed of an n-type semiconductor material and can be formed of, for example, n-InP.

The lower intermediate layer 102 is a layer that is provided on the lower spacer layer 101 and confines carriers in the active layer 103. The lower intermediate layer 102 is formed of an n-type semiconductor material and can be formed of a material containing Al, e.g., n-AlGaInAs. Further, the lower intermediate layer 102 may be formed of a material containing no Al and may be formed of, for example, n-InP.

The active layer 103 is provided on the lower intermediate layer 102 emits and amplifies spontaneous emission light. The active layer 103 can be a layer having a quantum well (QW) structure in which a quantum well layer having a small bandgap and a barrier layer having a large bandgap are alternately stacked. The active layer 103 can be formed of a material containing Al, e.g., AlGaInAs. Further, the active layer 103 may be formed of a material containing no Al and can be formed of, for example, InGaAs or InGaAsP. Further, the active layer 103 does not necessarily need to have a quantum well structure and may have a quantum dots (QDs) structure formed of InAs or the like.

The upper intermediate layer 104 is a layer that is provided on the active layer 103 and confines carriers in the active layer 103. The upper intermediate layer 104 is formed of a p-type semiconductor material and can be formed of a material containing Al, e.g., p-AlGaInAs. Further, the upper intermediate layer 104 may be formed of a material containing no Al and can be formed of, for example, p-InP.

Figure 5:
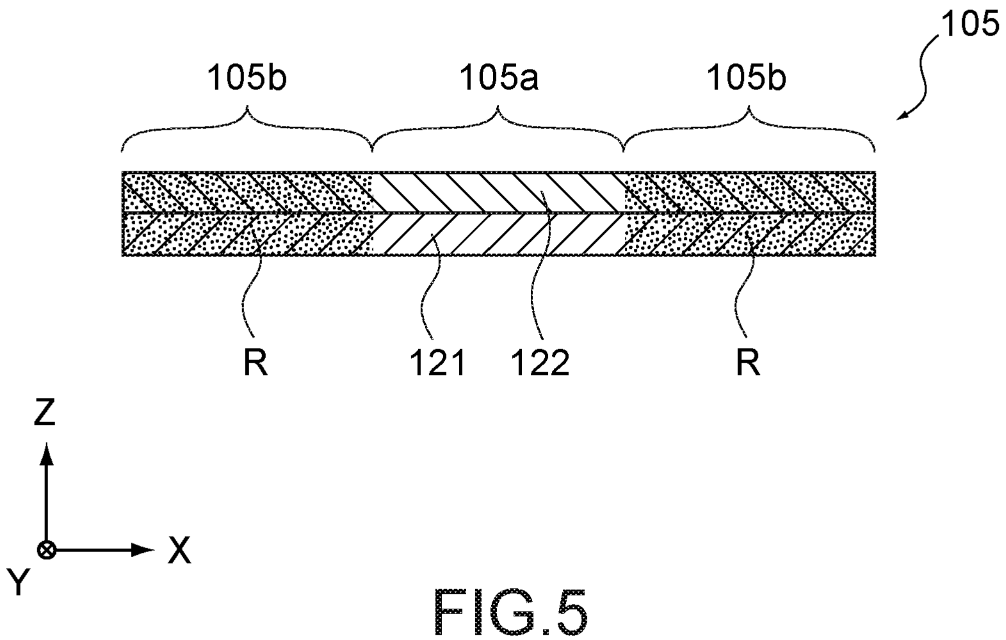
FIG. 5 is a cross-sectional view of a tunnel junction layer included in the VCSEL device.
Figure 6:
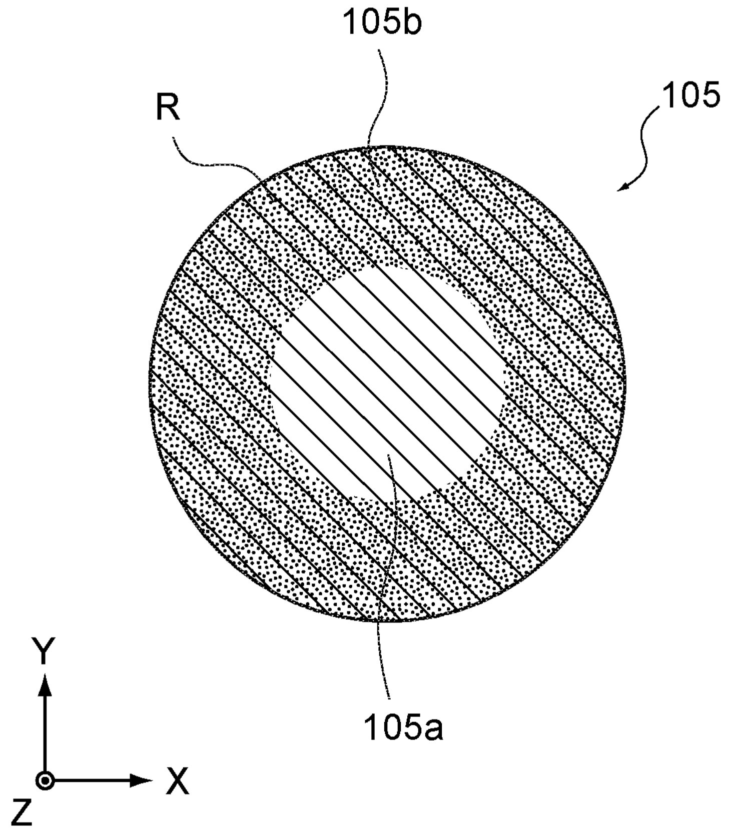
FIG. 6 is a plan view of a tunnel junction layer included in the VCSEL device.

The tunnel junction layer 105 is provided on the upper intermediate layer 104 and forms a current confinement structure by a tunnel junction. FIG. 5 is a cross-sectional view of the tunnel junction layer 105, and FIG. 6 is a plan view of the tunnel junction layer. As shown in FIG. 5, the tunnel junction layer 105 includes a first layer 121 and a second layer 122. The first layer 121 is a layer on the side of the upper intermediate layer 104 in the tunnel junction layer 105 and is formed of a p-type semiconductor material having a high impurity concentration. The second layer 122 is a layer on the side of the upper spacer layer 106 in the tunnel junction layer 105 and is formed of an n-type semiconductor material having a high impurity concentration.

The tunnel junction layer 105 can be formed of a substance containing Al. Examples of the substance containing Al include AlInAs and AlGaInAs. In the case of AlInAs, the first layer 121 can be formed of $p^+$-AlInAs and the second layer 122 can be formed of $n^+$-AlInAs. Further, in the case of AlGaInAs, the first layer 121 can be formed of $p^+$-AlGaInAs and the second layer 122 can be formed of $n^+$-AlGaInAs.

Further, the tunnel junction layer 105 can be formed of a substance containing no Al and can be formed of, for example, InP, InGaAsP, or InGaAs. In the case of InP, the first layer 121 can be formed of $p^+$-InP and the second layer 122 can be formed of $n^+$-InP. In the case of InGaAsP, the first layer 121 can be formed of $p^+$-InGaAsP and the second layer 122 can be formed of $n^+$-InGaAsP. In the case of InGaAs, the first layer 121 can be formed of $p^+$-InGaAs and the second layer 122 can be formed of $n^+$-InGaAs.

Further, the tunnel junction layer 105 can be formed of both a substance containing Al and a substance containing no Al, the materials of the first layer 121 and the second layer 122 being different from each other. Specifically, the first layer 121 can be formed of AlInAs or AlGaInAs containing Al and the second layer 122 can be formed of InP, InGaAsP, or InGaAs containing no Al. In this case, for example, the first layer 121 can be formed of $p^+$-AlInAs and the second layer 122 can be formed of $n^+$-InP.

Conversely, the first layer 121 can be formed of InP, InGaAsP, or InGaAs containing no Al and the second layer 122 can be formed of AlInAs or AlGaInAs containing Al. In this case, for example, the first layer 121 can be formed of $p^+$-InP and the second layer 122 can be formed of $n^+$-AlInAs.

Here, as described above, the tunnel junction layer 105 has the inner peripheral region 105*a* on the inner peripheral side as viewed from the Z direction and the outer peripheral region 105*b* surrounding the inner peripheral region 105*a* (see FIG. 4). Ions have been implanted into the outer peripheral region 105*b*, and ions have not been implanted into the inner peripheral region 105*a*. In FIG. 1 and the following figures, a region into which ions have been implanted in the VCSEL device 100 is referred to as an ion implantation region R and is indicated by a region drawn with dots. Due to the ion implantation, the impurity concentration of the outer peripheral region 105*b* is smaller than the impurity concentration of the inner peripheral region 105*a* and the carrier concentration (density of electrons and holes) of the outer peripheral region 105*b* is smaller than the carrier concentration of the inner peripheral region 105*a*.

Due to the decrease in carrier concentration in the outer peripheral region 105*b*, the tunnel junction between the first layer 121 and the second layer has disappeared as will be described below. Meanwhile, ions have not implanted into the inner peripheral region 105*a* and thus the tunnel junction between the first layer 121 and the second layer 122 is maintained. As a result, the electric resistance of the outer peripheral region 105*b* is larger than the electric resistance of the inner peripheral region 105*a*.

The ion species of the ions implanted into the outer peripheral region 105*b* can be an ion species that increases the bandgap between the first layer 121 and the second layer 122 and can be specifically O ions or N ions. Of these, O ions are more suitable because they are capable of oxidizing the outer peripheral region 105*b*.

The upper spacer layer 106 is a layer that is provided on the tunnel junction layer 105 and adjusts the interval between the lower DBR 108 and the upper DBR 109. The upper spacer layer 106 is formed of an n-type semiconductor material and can be, for example, n-InP.

The contact layer 107 is provided around the upper DBR 109 on the upper spacer layer 106 and provides electrical connection between the upper electrode 111 and the upper spacer layer 106. The contact layer 107 can have an annular shape surrounding the inner peripheral region 120*a* of the stacked body 120. The contact layer 107 is formed of an n-type semiconductor material having a high impurity concentration and can be formed of, for example, $n^+$-InGaAs, $n^+$-InGaAsP, or $n^+$-InP.

The lower DBR 108 is provided adjacent to the inner peripheral region 101*a* (see FIG. 4) of the lower spacer layer 101 and functions as a DBR (Distributed Bragg Reflector) that reflects light of a wavelength A. The lower DBR 108 sandwiches the stacked body 120 between the lower DBR 108 and the upper DBR 109 to constitute a resonator for laser oscillation. The lower DBR 108 is, for example, a dielectric DBR and can be $SiO_2$, $TiO_2$, $Ta_2O_5$, a-Si, $Al_2O_3$, or the like.

The upper DBR 109 is provided adjacent to the inner peripheral region 106*a* (see FIG. 4) of the upper spacer layer 106 and functions as a DBR (Distributed Bragg Reflector) that reflects light of the wavelength A. The upper DBR 109 sandwiches the stacked body 120 between the upper DBR 109 and the lower DBR 108 to constitute a resonator for laser oscillation. The upper DBR 109 is, for example, a dielectric DBR and can be $SiO_2$, $TiO_2$, $Ta_2O_5$, a-Si, $Al_2O_3$ or the like.

The lower electrode 110 is provided adjacent to the lower spacer layer 101 around the lower DBR 108 and functions as one electrode of the VCSEL device 100. The lower electrode 110 can be formed of, for example, Ti/Pt/Au, AuGe/Ni/Au, or the like. Further, the lower electrode 110 may be formed by plating.

The upper electrode 111 is formed adjacent to the contact layer 107 and functions as the other electrode of the VCSEL device 100. The upper electrode 111 can have an annular shape surrounding the upper DBR 109. The upper electrode 111 can be formed of, for example, Ti/Pt/Au.

The VCSEL device 100 has the configuration as described above. The configuration of the VCSEL device 100 is not limited to the one shown here and only needs to include at least the active layer 103, the tunnel junction layer 105, the lower DBR 108, and the upper DBR 109.

[Band Structure of VCSEL Device]

Figure 7:
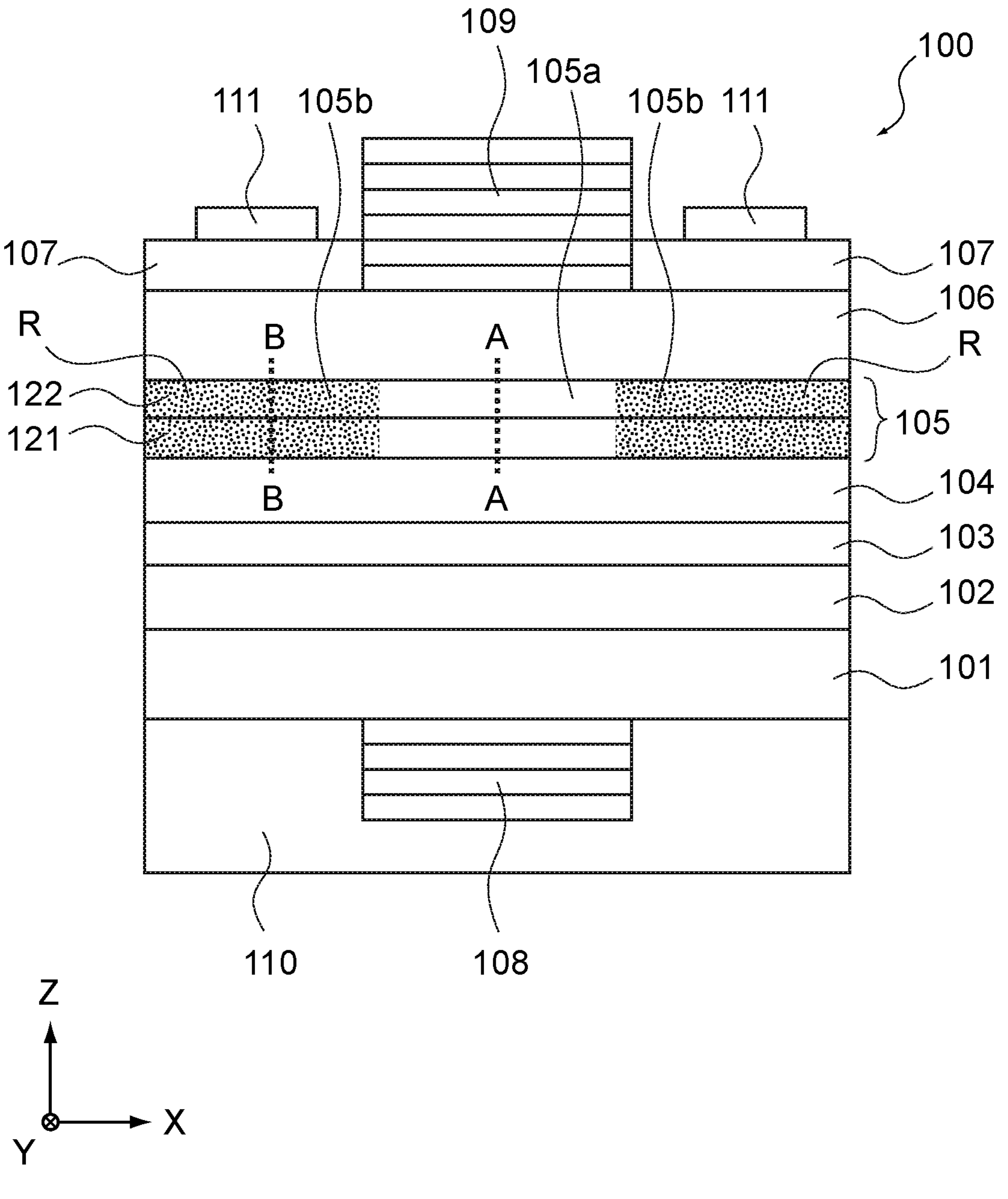
FIG. 7 is a schematic diagram of the VCSEL device.
Figure 8:
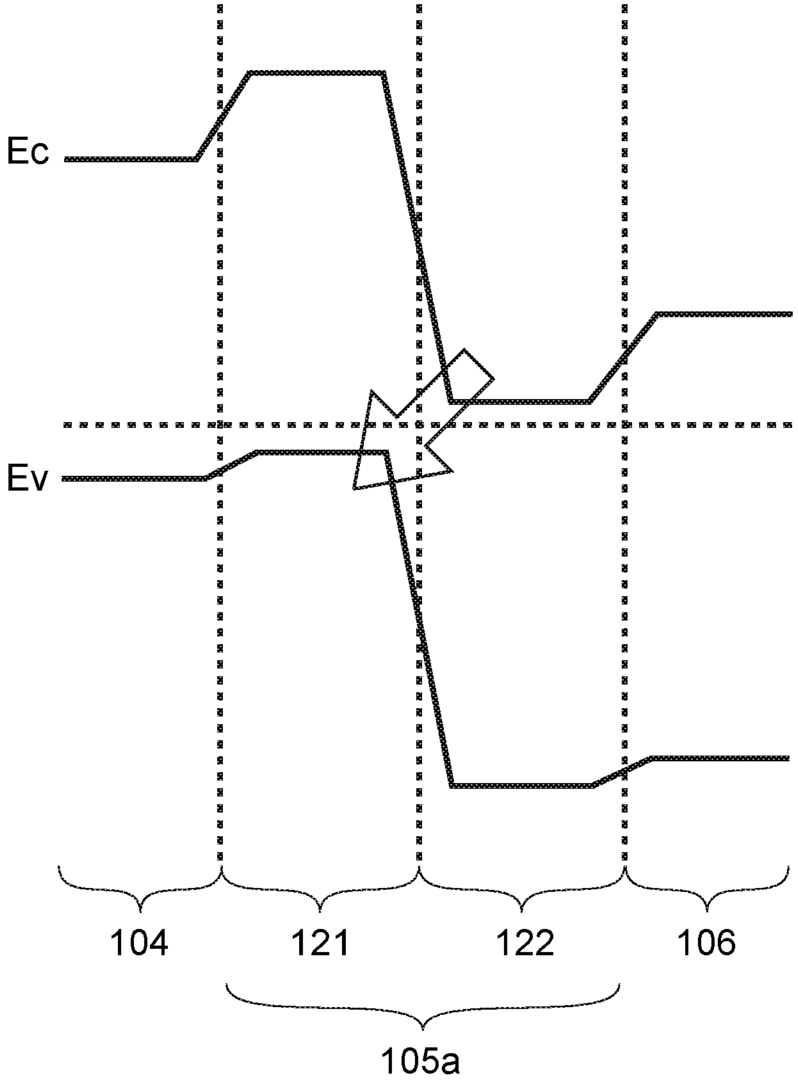
FIG. 8 is a band diagram showing a band structure of an inner peripheral region of the VCSEL device.

A band structure of the VCSEL device 100 will be described. FIG. 7 is a schematic diagram showing the VCSEL device 100. In FIG. 7, the line A-A is a line passing through the inner peripheral region 105*a* of the tunnel junction layer 105 and the line B-B is a line passing through the outer peripheral region 105*b* of the tunnel junction layer 105. FIG. 8 is a band diagram showing a band structure along the line A-A in FIG. 7 and FIG. 9 is a band diagram showing a band structure along the line B-B in FIG. 7.

As shown in FIG. 8, in the inner peripheral region 105*a* of the tunnel junction layer 105, a conduction band Ec of the first layer 121 and a Valence band Ev of the second layer 122 are close to each other at the boundary between the first layer 121 and the second layer 122 and a tunnel junction between the first layer 121 and the second layer 122 is formed. As a result, as indicated by an arrow in the figure, a current flows from the second layer 122 to the first layer 121.

Figure 9:
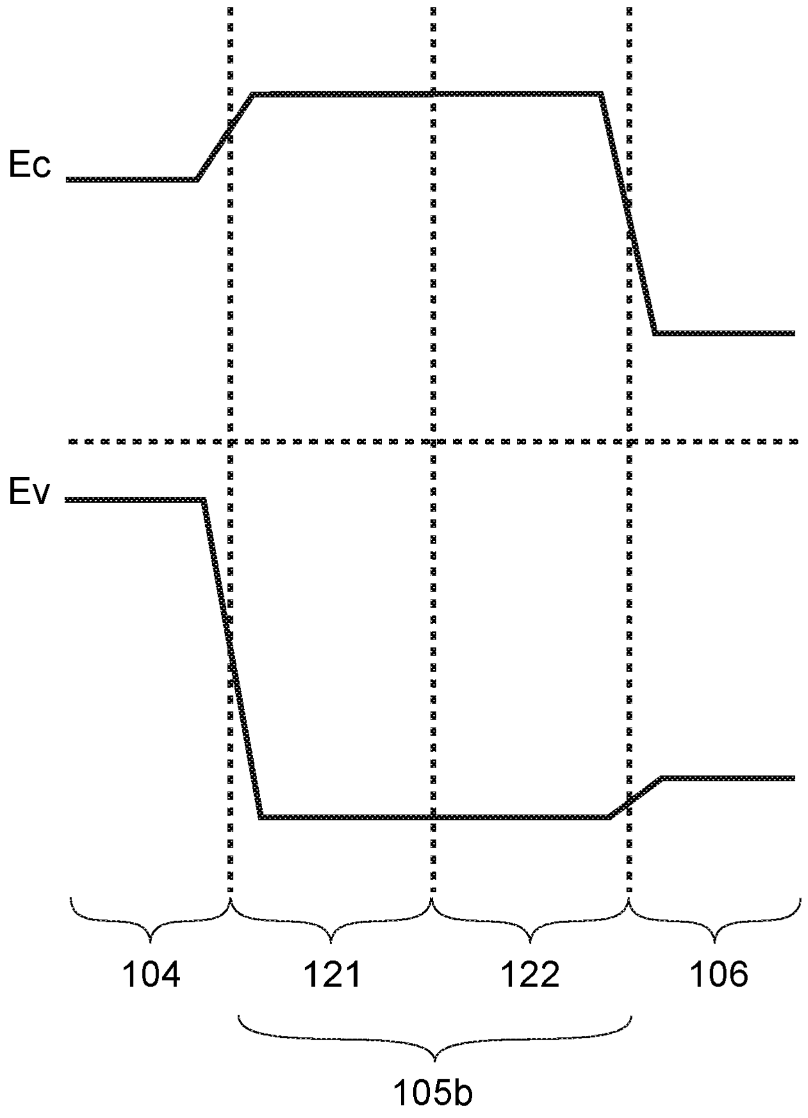
FIG. 9 is a band diagram showing a band structure of an outer peripheral region of the VCSEL device.

Meanwhile, as shown in FIG. 9, in the outer peripheral region 105*b* of the tunnel junction layer 105, the carrier concentration decreases by ion implantation and the interval (bandgap) between the conduction band Ec and the Valence band Ev increases in the first layer 121 and the second layer 122. As a result, the bandgap of the outer peripheral region 105*b* is larger than the bandgap of the inner peripheral region 105*a*. In the outer peripheral region 105*b*, since the tunnel junction between he first layer 121 and the second layer 122 disappears due to this increase in bandgap, no current flows between the first layer 121 and the second layer 122.

As described above, in the tunnel junction layer 105, a current flows through the inner peripheral region 105*a* by the tunnel junction but no current flows through the outer peripheral region 105*b* due to elimination of a tunnel junction. For this reason, a current flowing through the tunnel junction layer 105 is concentrated in the inner peripheral region 105*a*, i.e., a current confinement effect occurs.

Note that the ion species of ions to be implanted into the outer peripheral region 105*b* only needs to by an ion species that increases the bandgap between the conduction band Ec and the Valence band Ev in the first layer 121 and the second layer 122 as shown in FIG. 9 and can be, for example, O ions or N ions.

[Operation of VCSEL Device]

When a voltage is applied between the lower electrode 110 and the upper electrode 111, a current flows between the lower electrode 110 and the upper electrode 111 (see FIG. 1). The current is subjected to a current confinement effect by the tunnel junction in the tunnel junction layer 105 and is injected into a region of the active layer 103 close to the inner peripheral region 105*a* of the tunnel junction layer 105. As a result, spontaneous emission light occurs in the region. The spontaneous emission light travels in the stacking direction of the VCSEL device 100 (Z direction) and is reflected by the lower DBR 108 and the upper DBR 109.

Since the lower DBR 108 and the upper DBR 109 are configured to reflect light having the oscillation wavelength A, the component of the oscillation wavelength A of the spontaneous emission light forms a standing wave between the lower DBR 108 and the upper DBR 109 and is amplified by the active layer 103. When the injected current exceeds a threshold value, the light forming a standing wave is laser-oscillated and a laser beam is emitted through the upper DBR 109.

Here, in the VCSEL device 100, a current confinement structure is realized by implanting ions in the outer peripheral region 105*b* of the tunnel junction layer 105 to eliminate the tunnel junction of the outer peripheral region 105*b* as described above. Unlike the proton implant (see Patent Literature 1), since the crystal of the outer peripheral region 105*b* is not broken to increase the resistance, the light absorption in the outer peripheral region 105*b* is small and the loss due to light absorption is suppressed.

[Regarding Oxidization by Ion Implantation]

A current confinement structure is realized by implanting ions into the outer peripheral region 105*b* of the tunnel junction layer 105 as described above. Here, in the case where the tunnel junction layer 105 is formed of a substance containing Al (AlInAs or the like) and the outer peripheral region 105*b* is O ions, O is taken into the substance containing Al in the outer peripheral region 105*b* and the outer peripheral region 105*b* becomes a semi-insulator. As a result, in addition to the elimination of a tunnel junction, the semi-insulator makes the resistance of the outer peripheral region 105*b* higher, which is more suitable.

Further, by increasing the amount of O ions to be implanted into the outer peripheral region 105*b*, an Al oxide ($AlO_X$) is formed in the outer peripheral region 105*b*. For example, in the case where the first layer 121 is formed of $p^+$-AlInAs and the second layer 122 is formed of $n^+$-AlInAs in the inner peripheral region 105*a*, the outer peripheral region 105*b* can be formed of an AlInAs oxide.

By forming an Al oxide, the bandgap (see FIG. 9) of the outer peripheral region 105*b* is widened and the refractive index of the outer peripheral region 105*b* becomes smaller than the refractive index of the inner peripheral region 105*a*. As a result, light travelling between the lower DBR 108 and the upper DBR 109 travels more easily in the inner peripheral region 105*a* than in the outer peripheral region 105*b* and a light confinement effect in the layer surface direction (X-Y direction) occurs. For this reason, the amount of laser beams emitted from the VCSEL device 100 increases and the light emission properties of the VCSEL device 100 are improved.

[Regarding Method of Producing VCSEL Device]

A method of producing the VCSEL device 100 will be described. FIG. 10 to FIG. 21 are each a schematic diagram showing a method of producing the VCSEL device 100.

Figure 10:
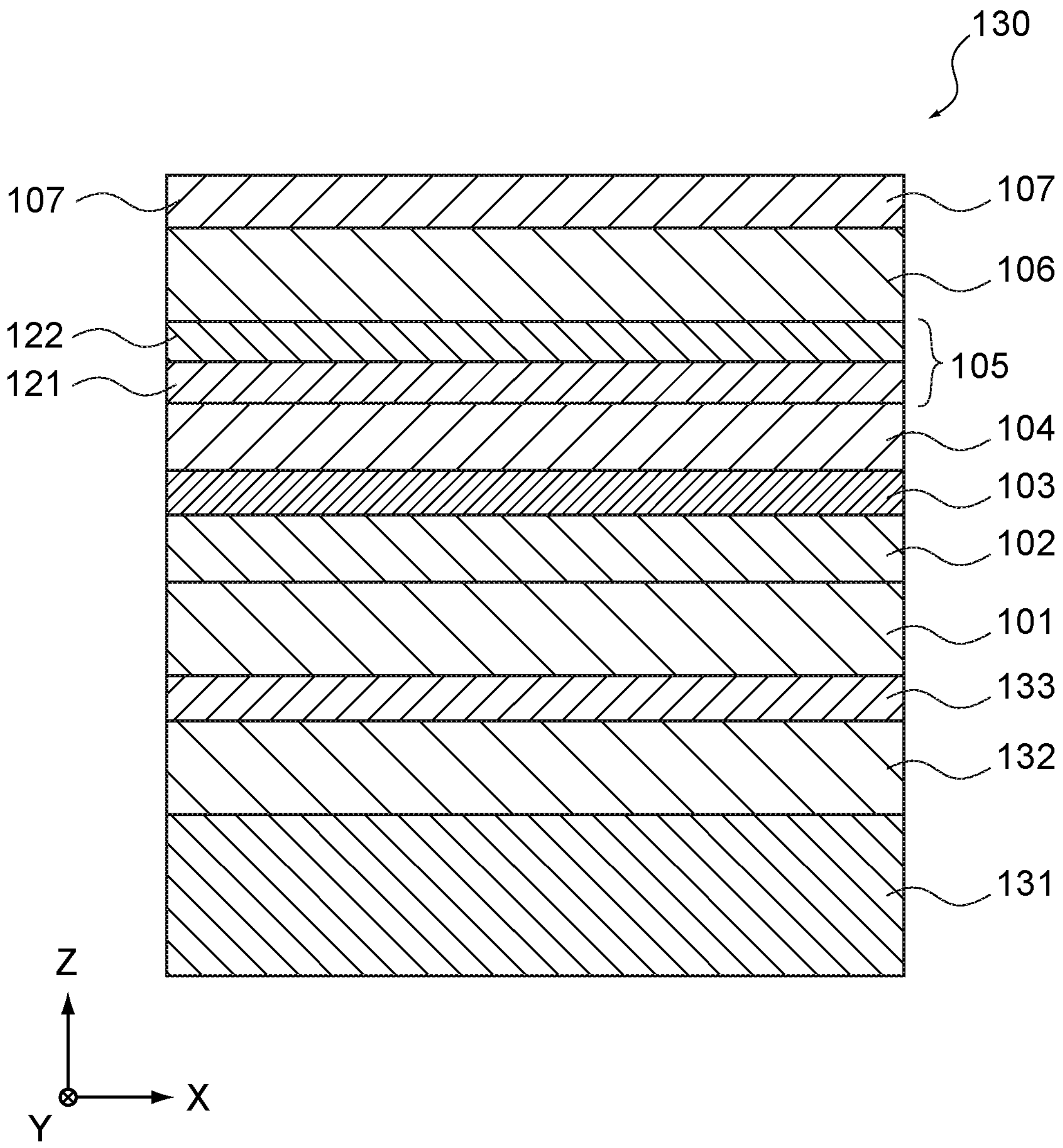
FIG. 10 is a schematic diagram showing a method of producing the VCSEL device.

As shown in FIG. 10, a semiconductor layer 132, an etching stop layer 133, the lower spacer layer 101, the lower intermediate layer 102, the active layer 103, the upper intermediate layer 104, the tunnel junction layer 105, the upper spacer layer 106, and the contact layer 107 are formed on a substrate 131 in order to prepare a stacked body 130. The respective layers can be formed by an epitaxial growth method.

Note that the substrate 131 is a substate formed of an n-type semiconductor material and can be, for example, an n-InP substrate. The semiconductor layer 132 is formed of an n-type semiconductor material and can be, for example, n-InP. The etching stop layer 133 is formed of an n-type semiconductor material and can be, for example, n-InGaAsP. The respective layers from the lower spacer layer 101 to the contact layer 107 are formed of the above-mentioned materials.

Figure 11:
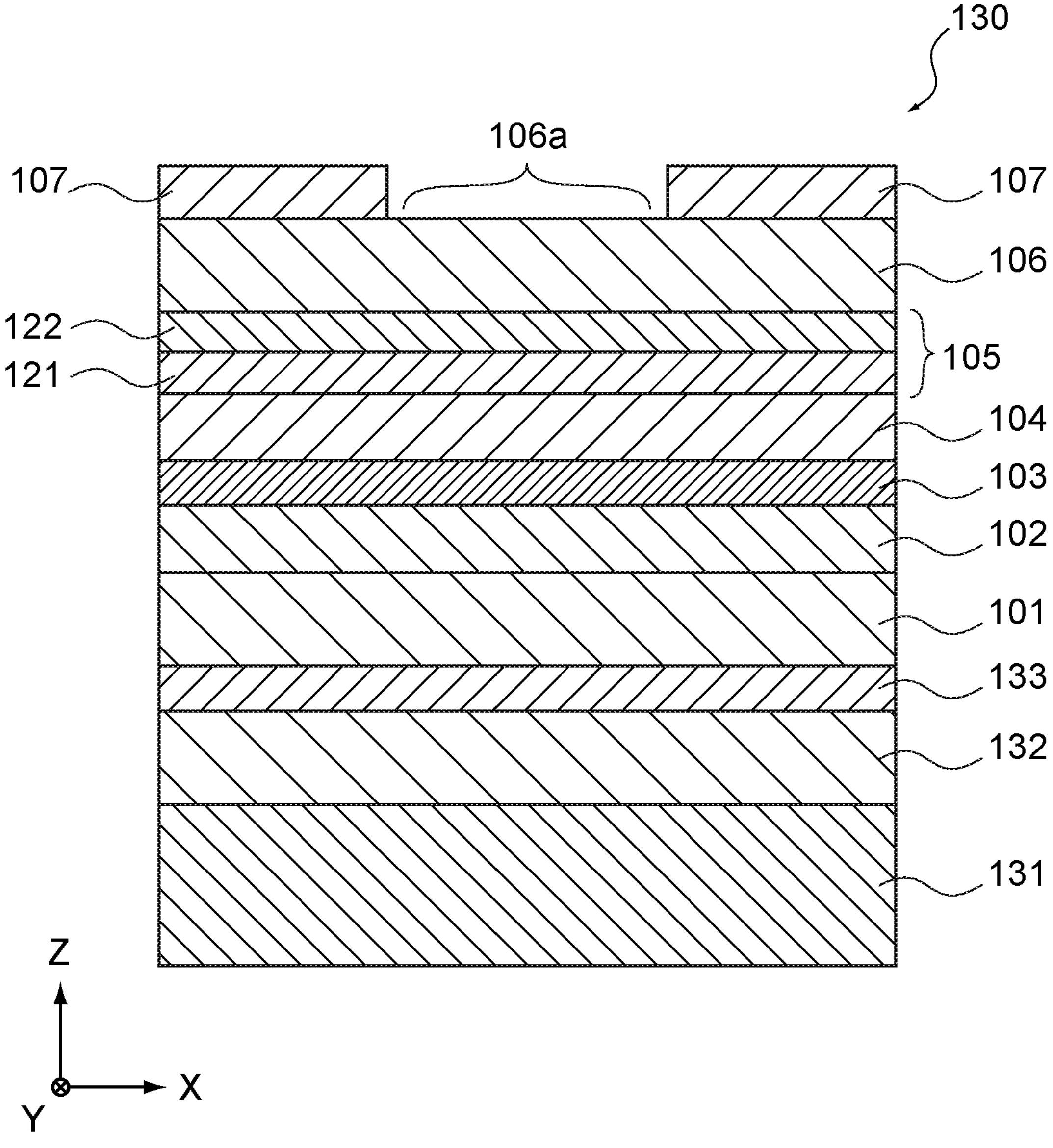
FIG. 11 is a schematic diagram showing the method of producing the VCSEL device.

Next, as shown in FIG. 11, the contact layer 107 is patterned to remove part of the contact layer 107 such that a region of the upper spacer layer 106 including the inner peripheral region 106*a* is exposed. The contact layer 107 can be patterned using photolithography and the unnecessary part can be removed by wet etching or chlorine-based dry etching. Note that the wet etching is more suitable and selective etching can be performed using a mixed solution of sulfuric acid: hydrogen peroxide: water or a mixed solution of citric acid: hydrogen peroxide: water as an etching solution.

Figure 12:
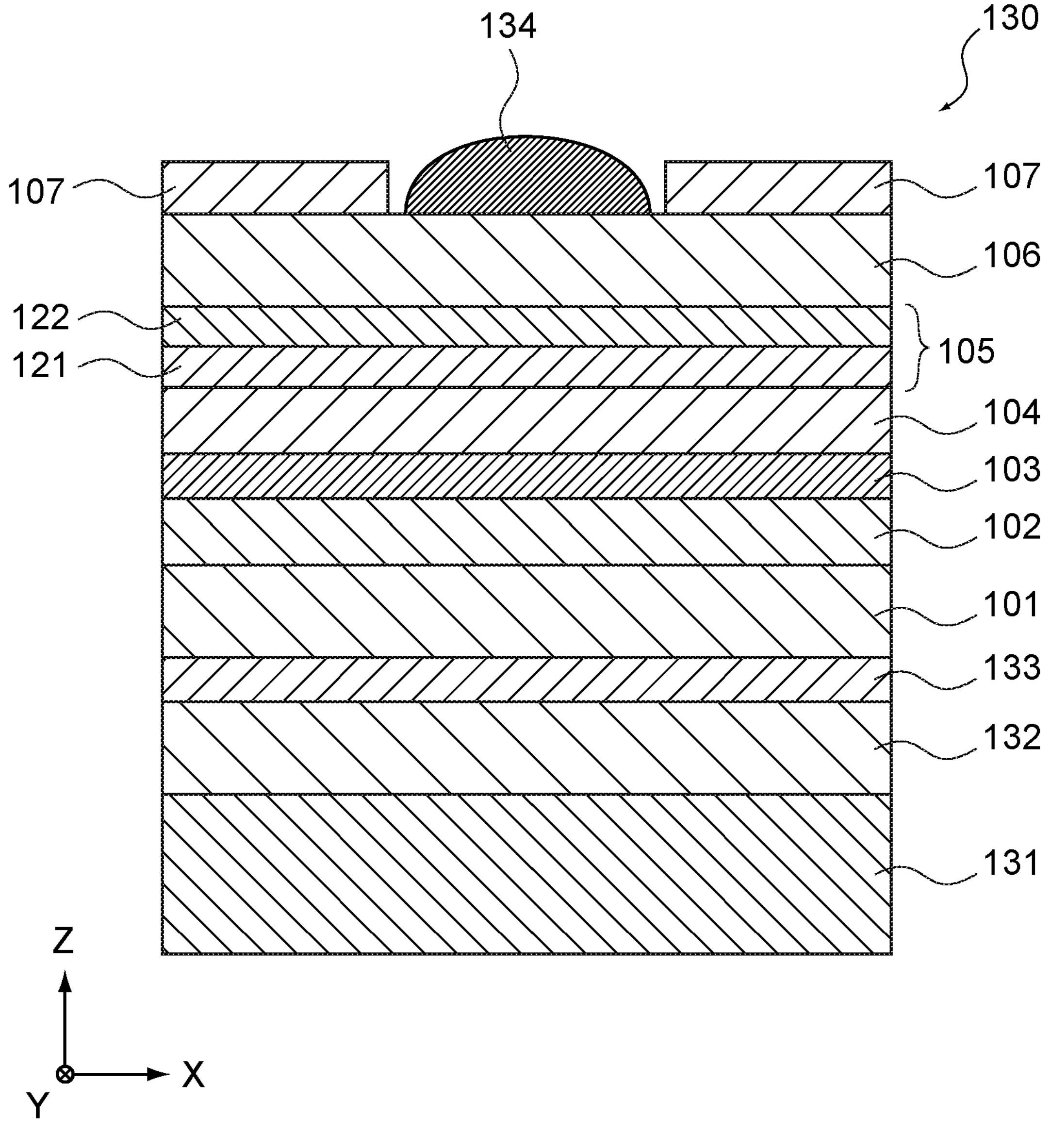
FIG. 12 is a schematic diagram showing the method of producing the VCSEL device.

Next, as shown in FIG. 12, a resist 134 is formed on the upper spacer layer 106 exposed in the previous process, and the inner peripheral region 106*a* is covered by the resist 134. The resist 134 can be formed by patterning using photolithography.

Figure 13:
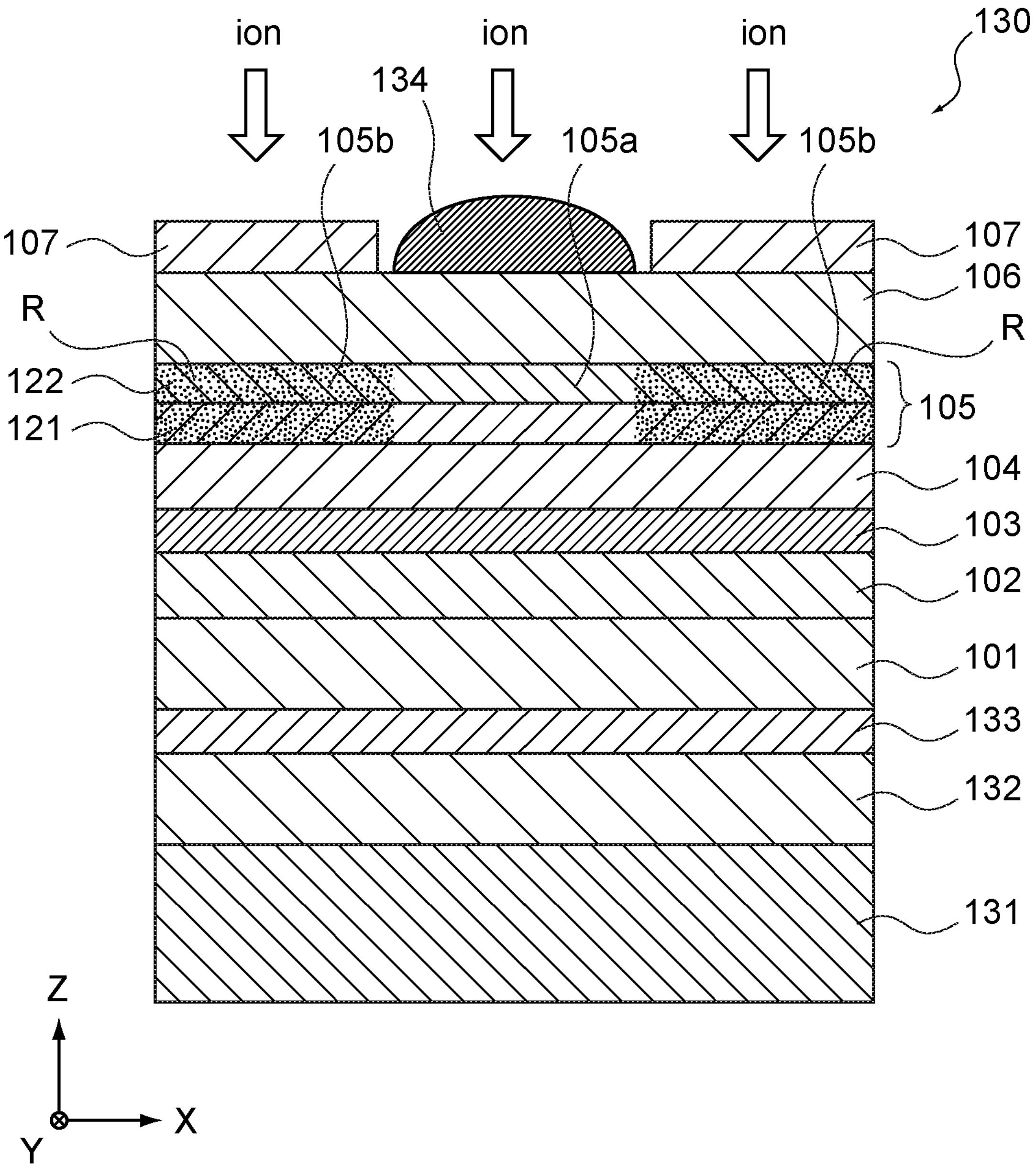
FIG. 13 is a schematic diagram showing the method of producing the VCSEL device.

Subsequently, as shown in FIG. 13, ions are implanted from above the contact layer 107 and the resist 134. Here, the ions that have entered the inner peripheral region 120*a* (see FIG. 2) are shielded by the resist 134. Meanwhile, the ions that have entered the outer peripheral region 120*b* are implanted into the outer peripheral region 105*b* of the tunnel junction layer 105 to form the ion implantation region R. As a result, in the tunnel junction layer 105, the inner peripheral region 105*a* through which a current passes by a tunnel junction and the outer peripheral region 105*b* through which no current passes due to elimination of a tunnel junction are formed.

Here, in the case where the tunnel junction layer 105 is formed of a substance containing Al and the ions are O ions, it is possible to oxidize Al present in the outer peripheral region 105*b* to form an Al oxide ($AlO_X$), by increasing the amount of O ions to be implanted.

For example, in the case where the tunnel junction layer 105 is formed of a substance containing Al, it is possible to generate an Al oxide in the outer peripheral region 105*b* by implanting O ions to reach the depth just before the upper intermediate layer 104. Since the contact layer 107 and the upper spacer layer 106 are each formed of a substance containing no Al, they are not oxidized by the implanted O ions.

Figure 14:
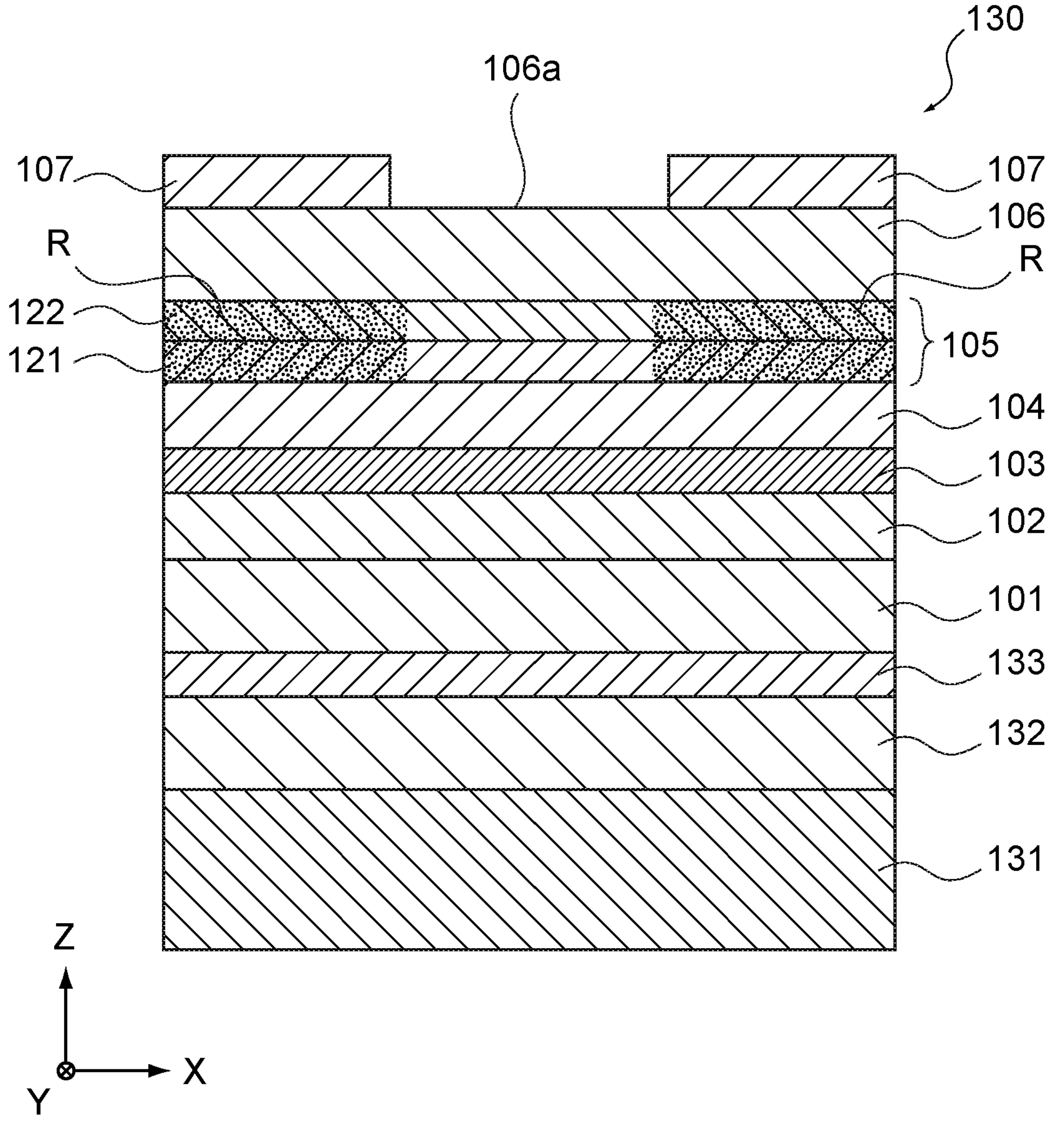
FIG. 14 is a schematic diagram showing the method of producing the VCSEL device.

Subsequently, as shown in FIG. 14, the resist 134 is removed. Further, annealing treatment is performed. The contact layer 107 and the upper spacer layer 106 have crystal defects due to the ion implantation in the previous process and decreased conductivity, but the crystal defects can be repaired and the decrease in conductivity can be resolved by the annealing treatment. Further, the above-mentioned oxidation of the outer peripheral region 105*b* can be promoted by the annealing treatment.

Figure 15:
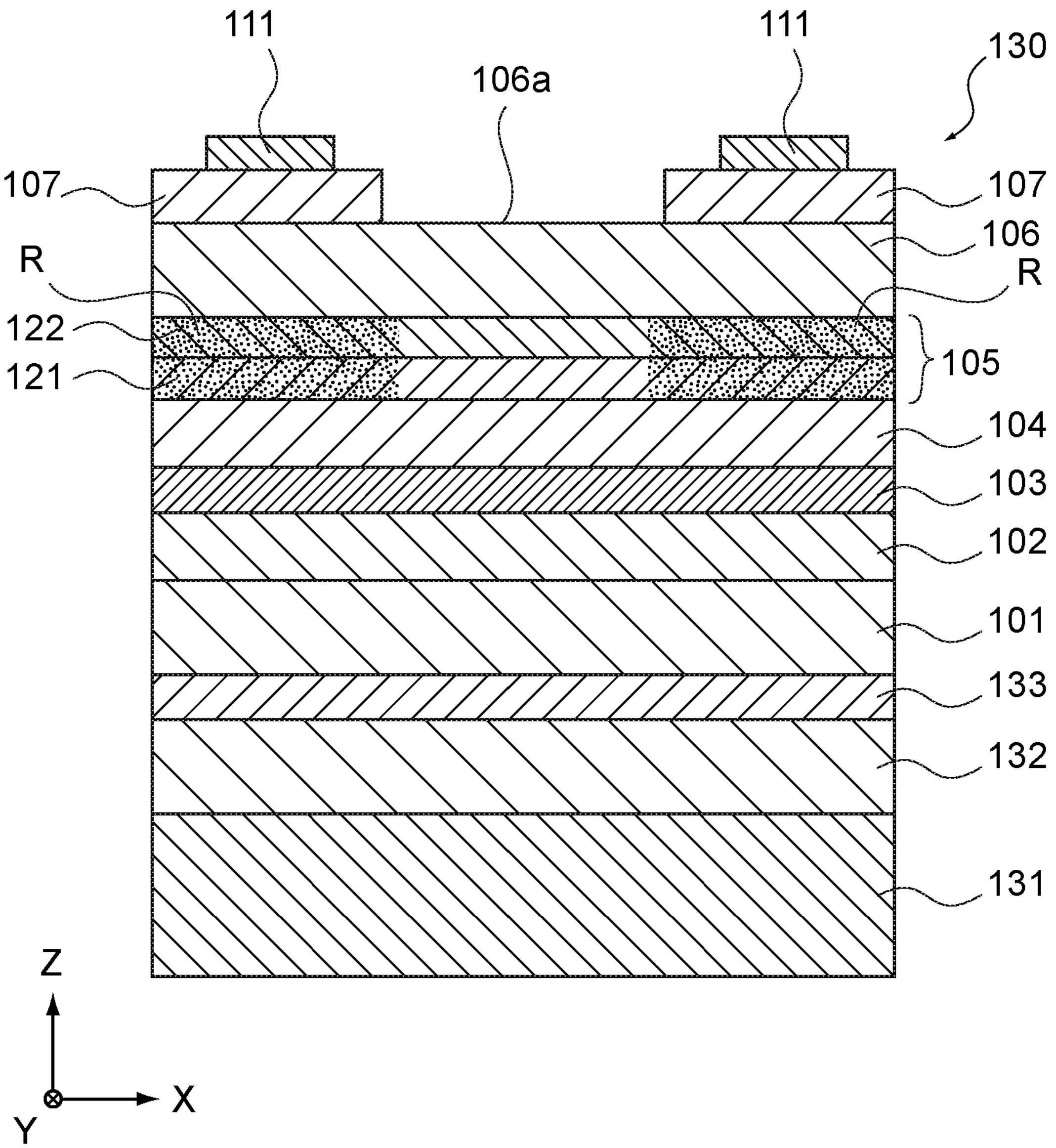
FIG. 15 is a schematic diagram showing the method of producing the VCSEL device.

Subsequently, as shown in FIG. 15, the upper electrode 111 is formed on the contact layer 107. The upper electrode 111 can be formed by patterning using photolithography.

Figure 16:
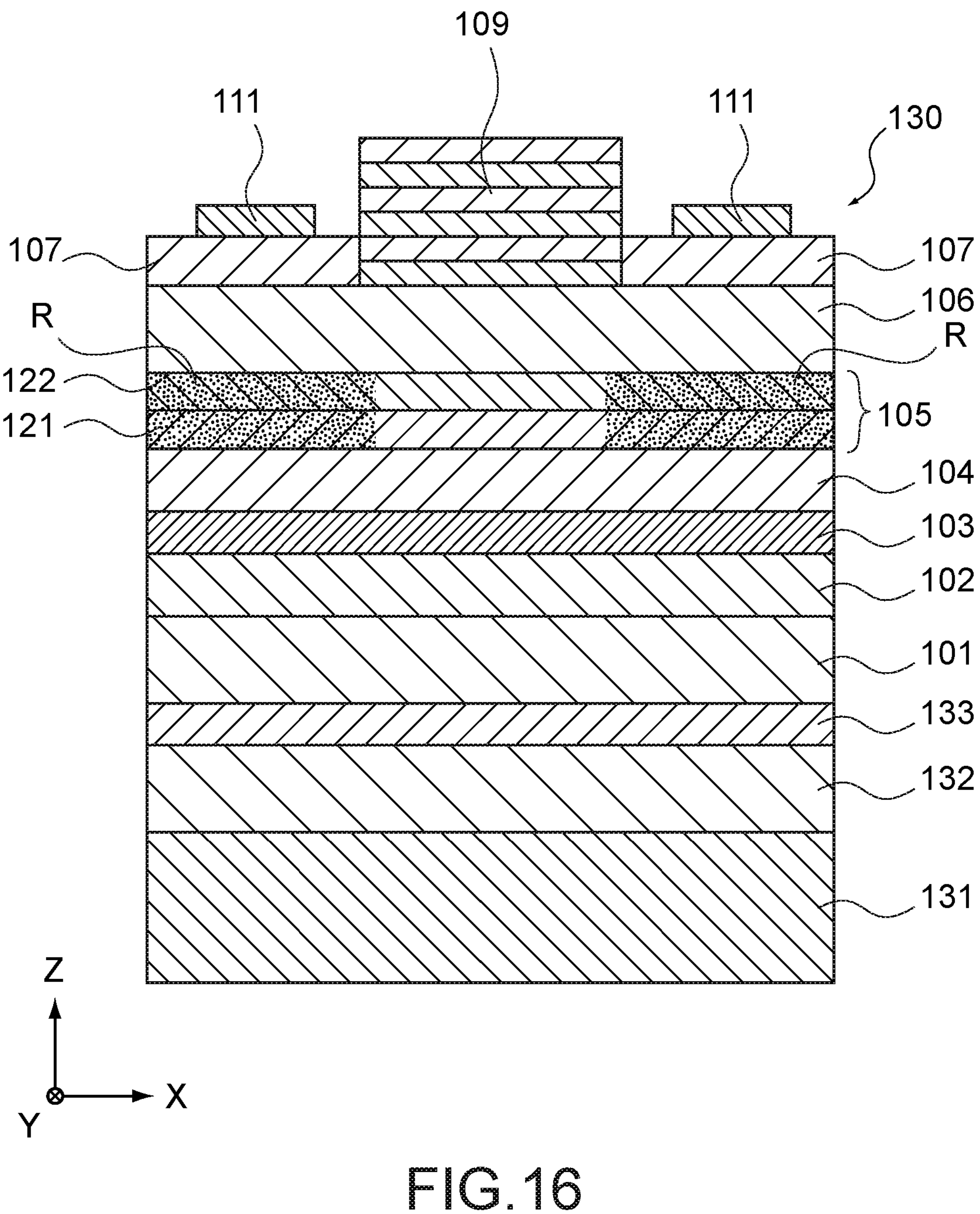
FIG. 16 is a schematic diagram showing the method of producing the VCSEL device.

Subsequently, as shown in FIG. 16, the upper DBR 109 is formed on the inner peripheral region 106*a* of the upper spacer layer 106. The upper DBR 109 can be patterned by an opening or the like by lift-off or dry etching and formed.

Figure 17:
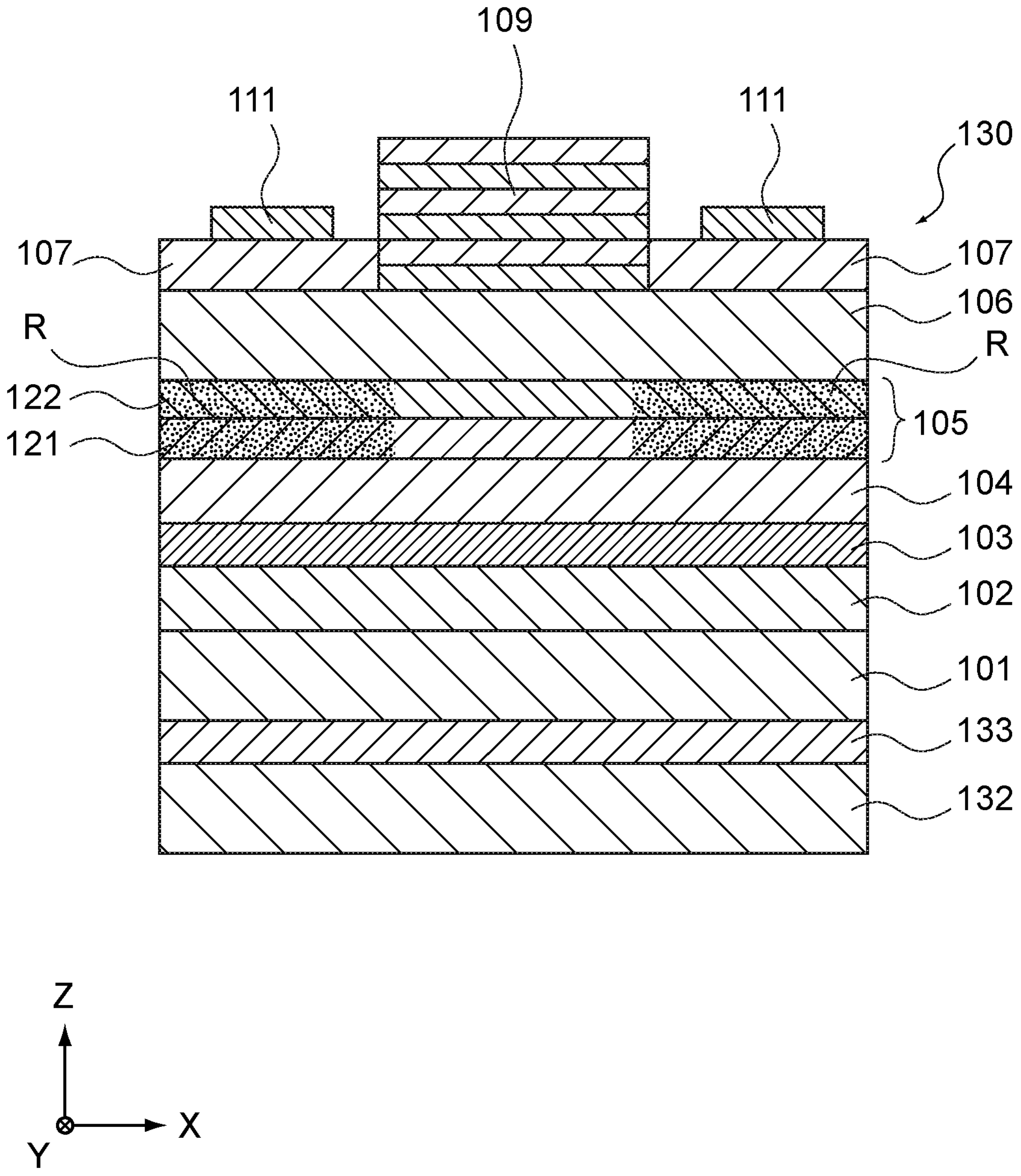
FIG. 17 is a schematic diagram showing the method of producing the VCSEL device.

Subsequently, as shown in FIG. 17, the substrate 131 is removed. The substrate 131 can be removed by bonding the stacked body 130 to a support substrate and griding the substrate 131 by a back grinder or the like.

Figure 18:
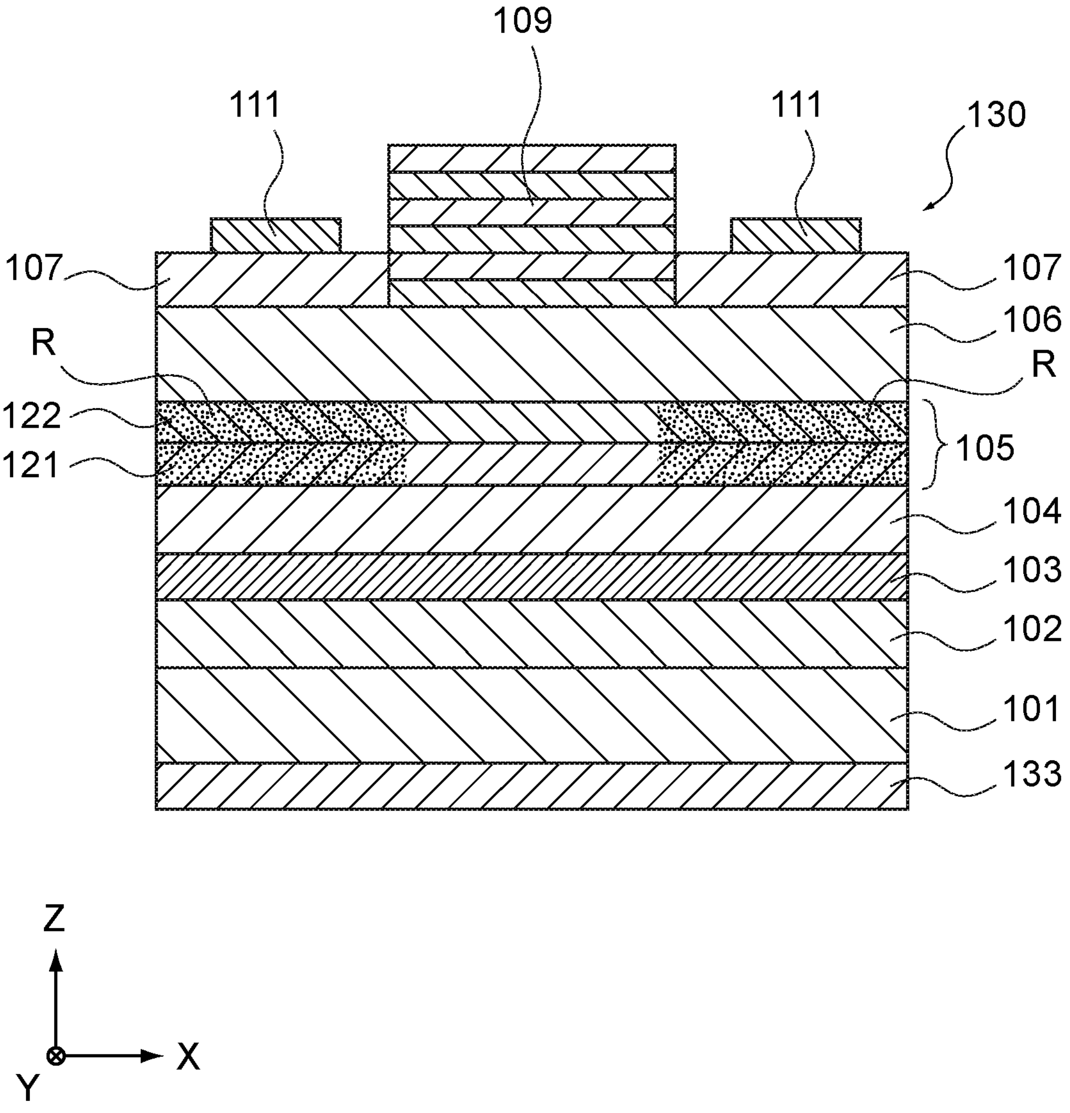
FIG. 18 is a schematic diagram showing the method of producing the VCSEL device.

Subsequently, as shown in FIG. 18, the semiconductor layer 132 is removed. The semiconductor layer 132 can be removed by wet etching using a mixed solution of nitric acid: phosphoric acid, or the like as an etching solution, because selective etching is performed between the semiconductor layer 132 and the etching stop layer 133.

Figure 19:
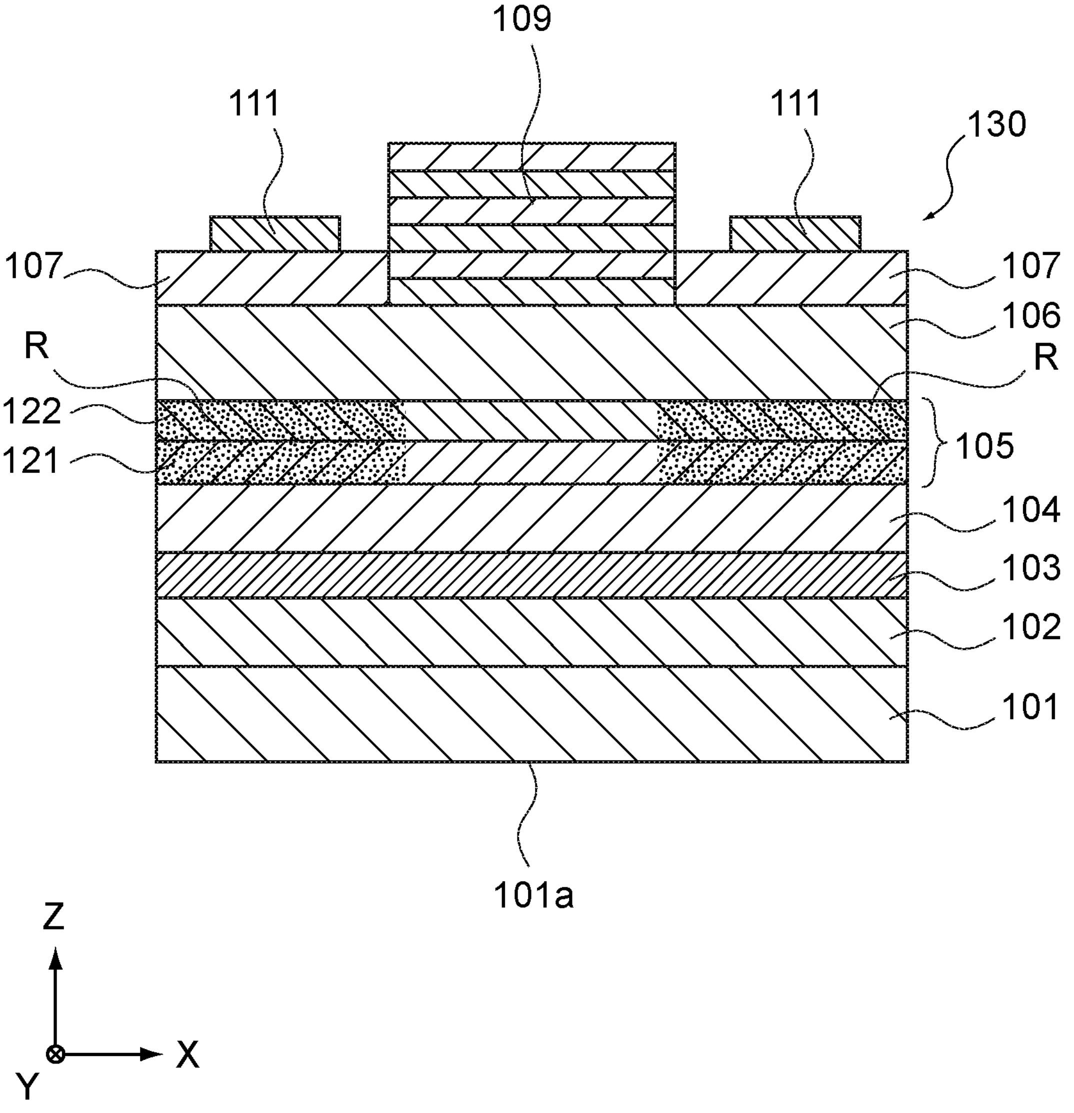
FIG. 19 is a schematic diagram showing the method of producing the VCSEL device.

Subsequently, as shown in FIG. 19, the etching stop layer 133 is removed. The etching stop layer 133 can be removed by wet etching using a mixed solution of sulfuric acid: hydrogen peroxide: water, or the like as an etching solution, because selective etching is performed between the etching stop layer 133 and the lower spacer layer 101.

Figure 20:
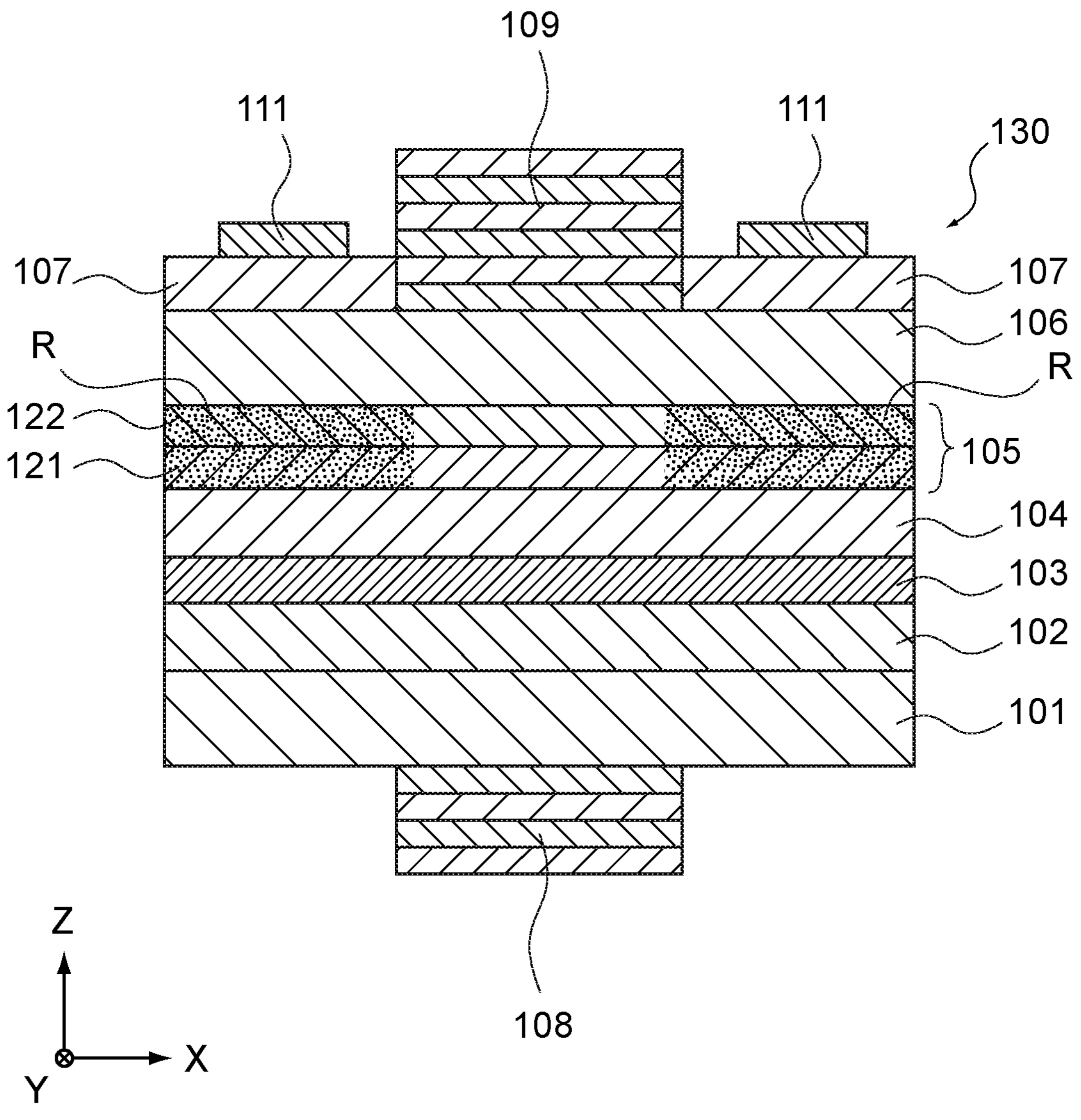
FIG. 20 is a schematic diagram showing the method of producing the VCSEL device.

Subsequently, as shown in FIG. 20, the lower DBR 108 is formed on the inner peripheral region 101*a* of the lower spacer layer 101. The lower DBR 108 can be patterned by an opening or the like by lift-off or dry etching and formed.

Figure 21:
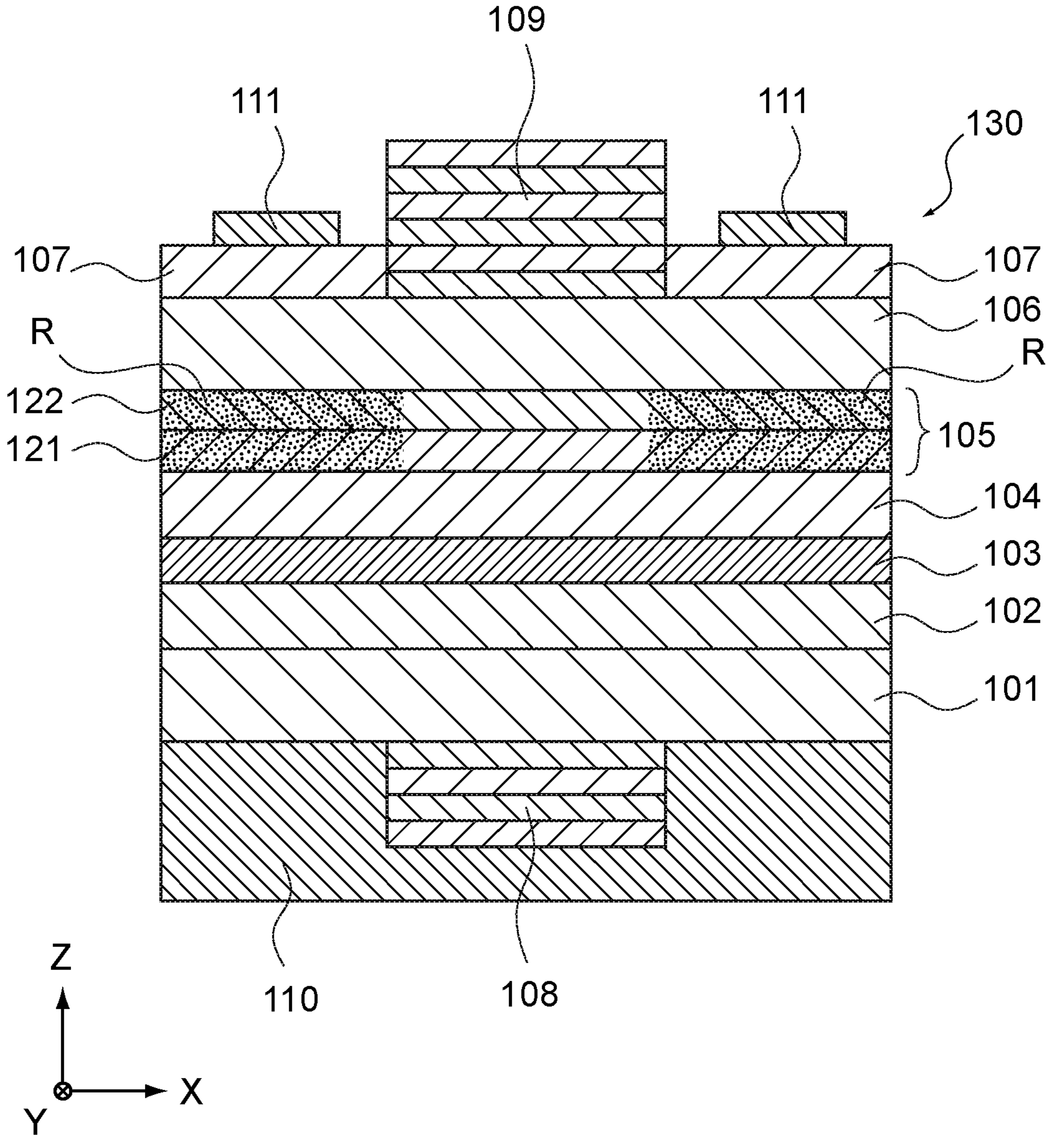
FIG. 21 is a schematic diagram showing the method of producing the VCSEL device.

Subsequently, as shown in FIG. 21, the lower electrode 110 is formed on the lower spacer layer 101 and the lower DBR 108. The lower electrode 110 can be formed by plating.

In this way, the VCSEL device 100 can be prepared. Note that the method of producing the VCSEL device 100 is not limited to the one shown here and only needs to include at least a process of implanting ions into the outer peripheral region 105*b* of the tunnel junction layer 105.

[Effects of VCEL Device]

As described above, the VCSEL device 100 is capable of achieving a current confinement effect by reducing the carrier concentration by implanting ions into the outer peripheral region 105*b* of the tunnel junction layer 105 to eliminate the tunnel junction. Since a current confinement structure is realized not by breaking the crystal in the outer peripheral region 105*b*, the light absorption in the outer peripheral region 105*b* is small and the loss due to light absorption can be suppressed. For this reason, the VCSEL device 100 is suitable for high output. Further, in the VCSEL device 100, a buried growth process is unnecessary for forming a current confinement structure unlike a buried tunnel junction structure, excellent producibility can be achieved.

Further, in the VCSEL device 100, in the case where the tunnel junction layer 105 is formed of a substance containing Al and the ions to be implanted into the outer peripheral region 105*b* are O ions, it is possible to form an Al oxide ($AlO_X$) in the outer peripheral region 105*b* by increasing the amount of O ions to be implanted. Since the refractive index of the outer peripheral region 105*b* decreases by forming an Al oxide, it is possible to achieve a light confinement effect by the tunnel junction layer 105 and improve the light emission properties of the VCSEL device 100.

Further, by performing annealing treatment after implanting O ions, it is possible to decrease the carrier concentration of the outer peripheral region 105*b*, promote the formation of an Al oxide, and improve the reliability of the VCSEL device 100 by improvement in the crystal quality and strong oxidation.

[Regarding Ion Implantation Region]

Figure 22:
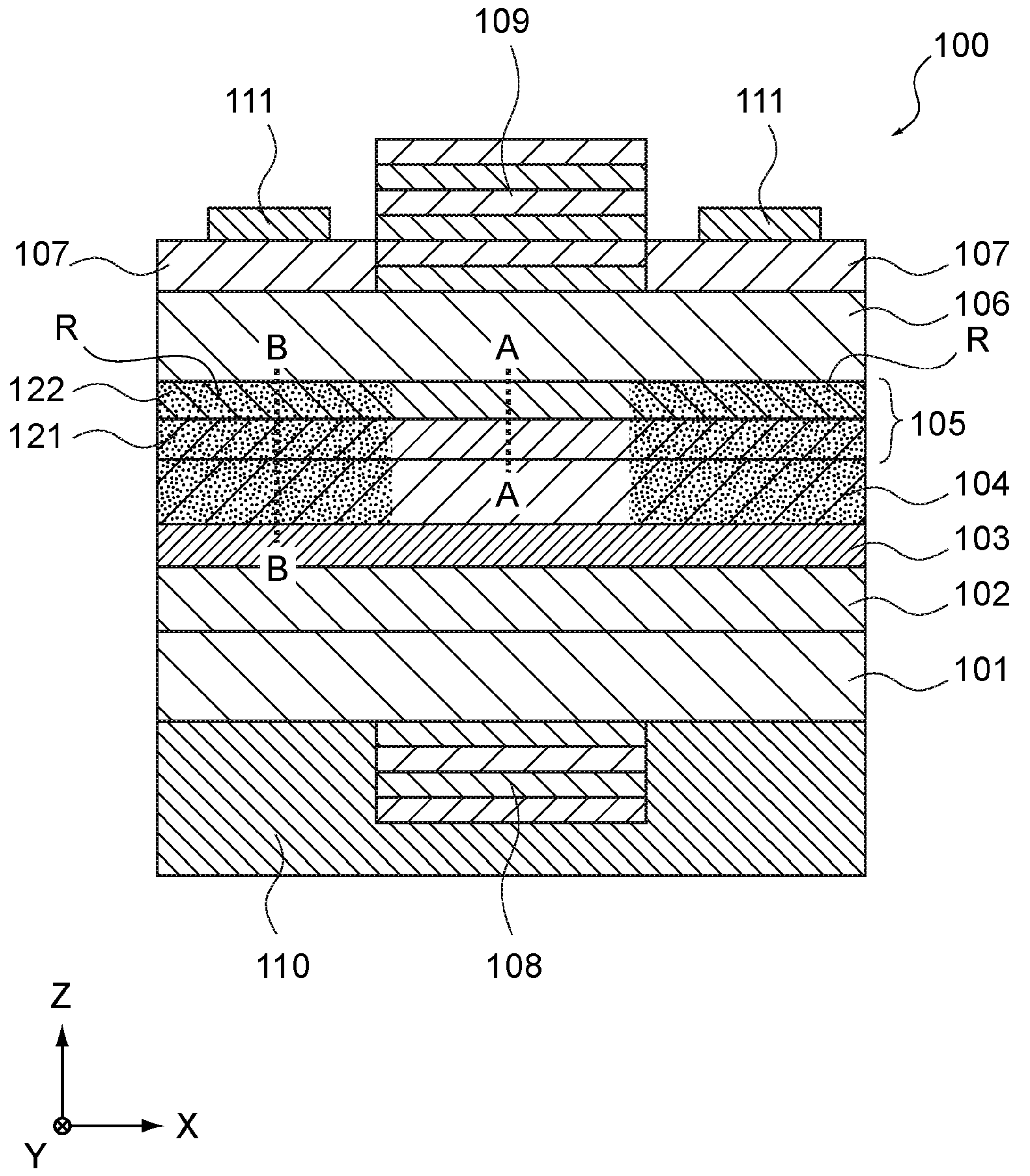
FIG. 22 is a schematic diagram showing a disposition example 1 of an ion implantation region of the VCSEL device.
Figure 23:
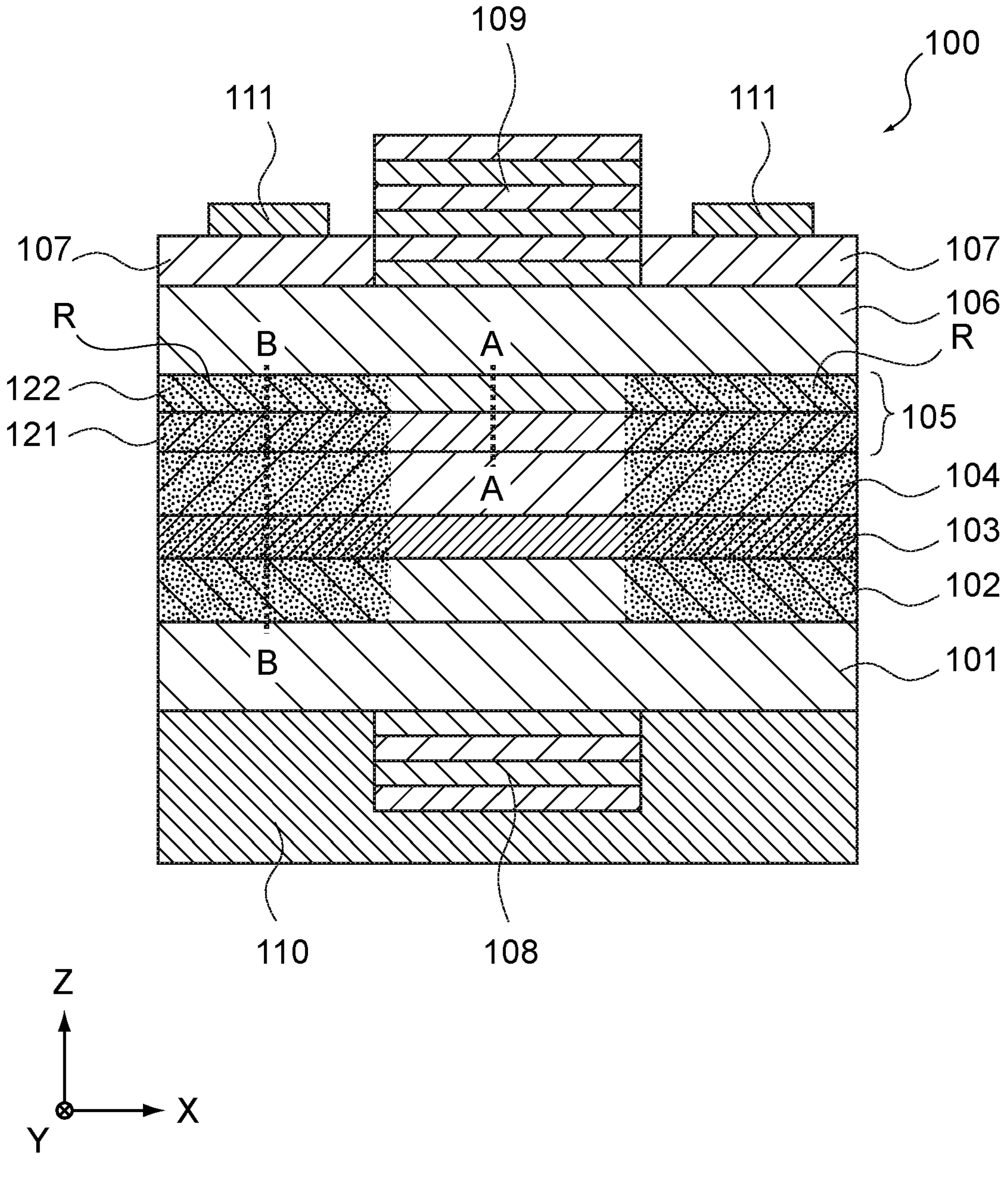
FIG. 23 is a schematic diagram showing a disposition example 2 of the ion implantation region of the VCSEL device.
Figure 24:
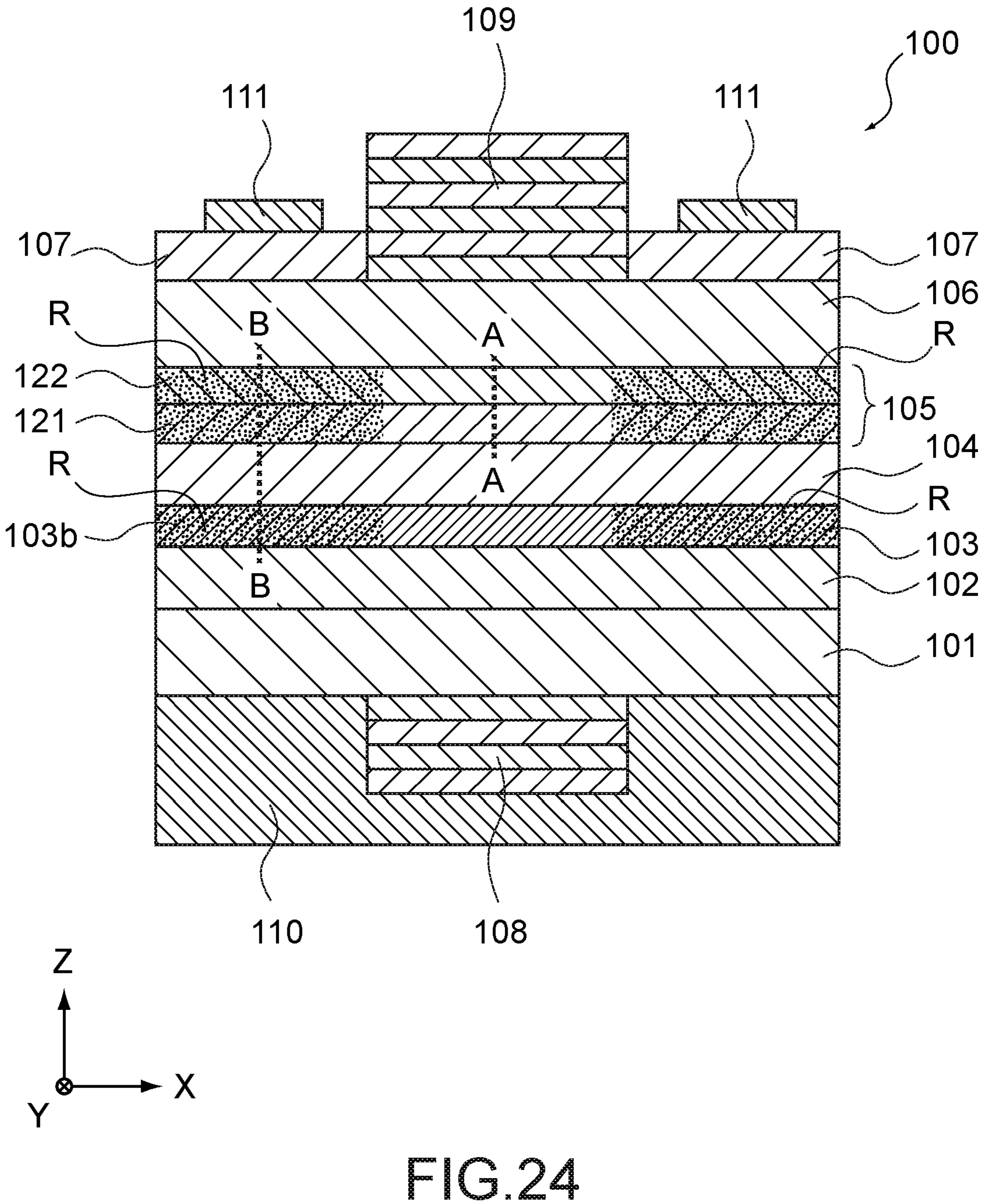
FIG. 24 is a schematic diagram showing a disposition example 3 of the ion implantation region of the VCSEL device.

Although ions are implanted into the outer peripheral region 105*b* of the tunnel junction layer 105 in the VCSEL device 100 in the above description, ions may be implanted into another layer of the VCSEL device 100. FIG. 22 to FIG. 24 are each a cross-sectional view of the VCSEL device 100 in which ions are implanted into a layer other than the tunnel junction layer 105.

(Ion Implantation Region 1)

As shown in FIG. 22, in the VCSEL device 100, ions may be implanted into the upper intermediate layer 104 in addition to the tunnel junction layer 105. In the upper intermediate layer 104, ions may be implanted into the outer peripheral region 104*b* (see FIG. 4) and no ions may be implanted into the inner peripheral region 104*a*.

Figure 25:
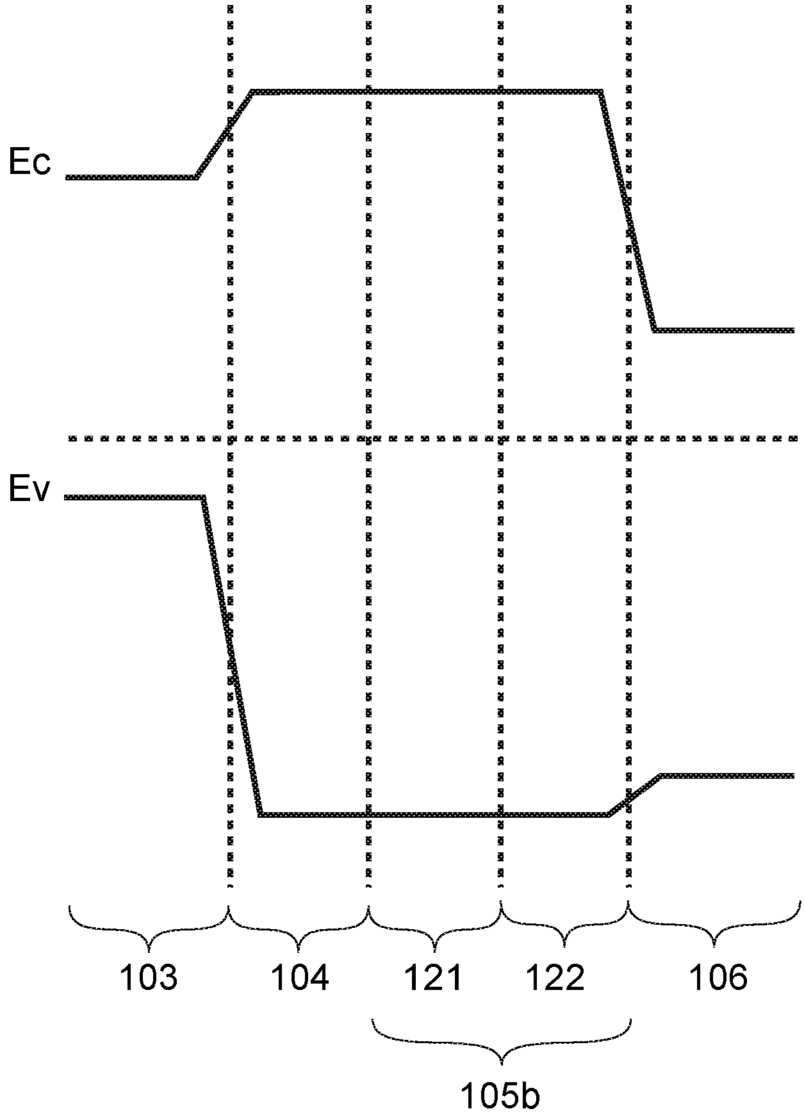
FIG. 25 is a band diagram showing a band structure of an outer peripheral region in the disposition example 1 of the VCSEL device.

FIG. 25 is a band diagram showing a band structure along the line B-B of the VCSEL device 100 shown in FIG. 22. Note that the band structure along the line A-A of the VCSEL device 100 shown in FIG. 22 is the same as that in FIG. 8.

As shown in FIG. 25, in the outer peripheral region 105*b* of the tunnel junction layer 105, the carrier concentration decreases due to ion implantation and a tunnel junction disappears due to the increase in bandgap. Further, in the outer peripheral region 104*b* of the upper intermediate layer 104, a bandgap increases similarly to the outer peripheral region 105*b*. For this reason, also in the configuration shown in FIG. 22, a current confinement structure by the tunnel junction layer 105 is realized.

Ions can be implanted into the outer peripheral region 105*b* and the outer peripheral region 104*b* by providing a resist on the inner peripheral region 120*a* and applying ions thereto from above (see FIG. 13). At this time, by setting the depth of the ion implantation to just before the active layer 103, ions can be implanted into the outer peripheral region 105*b* and the outer peripheral region 104*b*.

Note that in the case where the tunnel junction layer 105 and the upper intermediate layer 104 are each formed of a substance containing Al, it is possible to form an Al oxide in the outer peripheral region 105*b* and the outer peripheral region 104*b* by implanting O ions into the outer peripheral region 105*b* and the outer peripheral region 104*b*. As a result, since the refractive index of the outer peripheral region 105*b* can be made smaller than the refractive index of the inner peripheral region 105*a* and the refractive index of the outer peripheral region 104*b* can be made smaller than the refractive index of the inner peripheral region 104*a*, it is possible to achieve light confinement by the tunnel junction layer 105 and the upper intermediate layer 104.

Specifically, the tunnel junction layer 105 can be formed of $n^+$-AlInAs and $p^+$-AlInAs and the upper intermediate layer 104 can be formed of p-AlGaInAs. Further, the active layer 103 is formed of a substance containing no Al and can be formed of, for example, InGaAs. As a result, it is possible to form an Al oxide only in the outer peripheral region of each of the tunnel junction layer 105 and the upper intermediate layer 104. The lower intermediate layer 102 may be formed of a substance containing Al, such as n-AlGaInAs, and may be formed of a substance containing no Al, such as n-InP.

(Ion Implantation Region 2)

As shown in FIG. 23, in the VCSEL device 100, ions may be implanted into the upper intermediate layer 104, the active layer 103, and the lower intermediate layer 102 in addition to the tunnel junction layer 105. In the upper intermediate layer 104, ions may be implanted into the outer peripheral region 104*b* (see FIG. 4) and no ions may be implanted into the inner peripheral region 104*a*.

Further, in the active layer 103, ions may be implanted into the outer peripheral region 103*b* (see FIG. 4) and no ions may be implanted into the inner peripheral region 103*a*.

In the lower intermediate layer 102, ions may be implanted into the outer peripheral region 102*b* (see FIG. 4) and no ions may be implanted into the inner peripheral region 102*a*.

Figure 26:
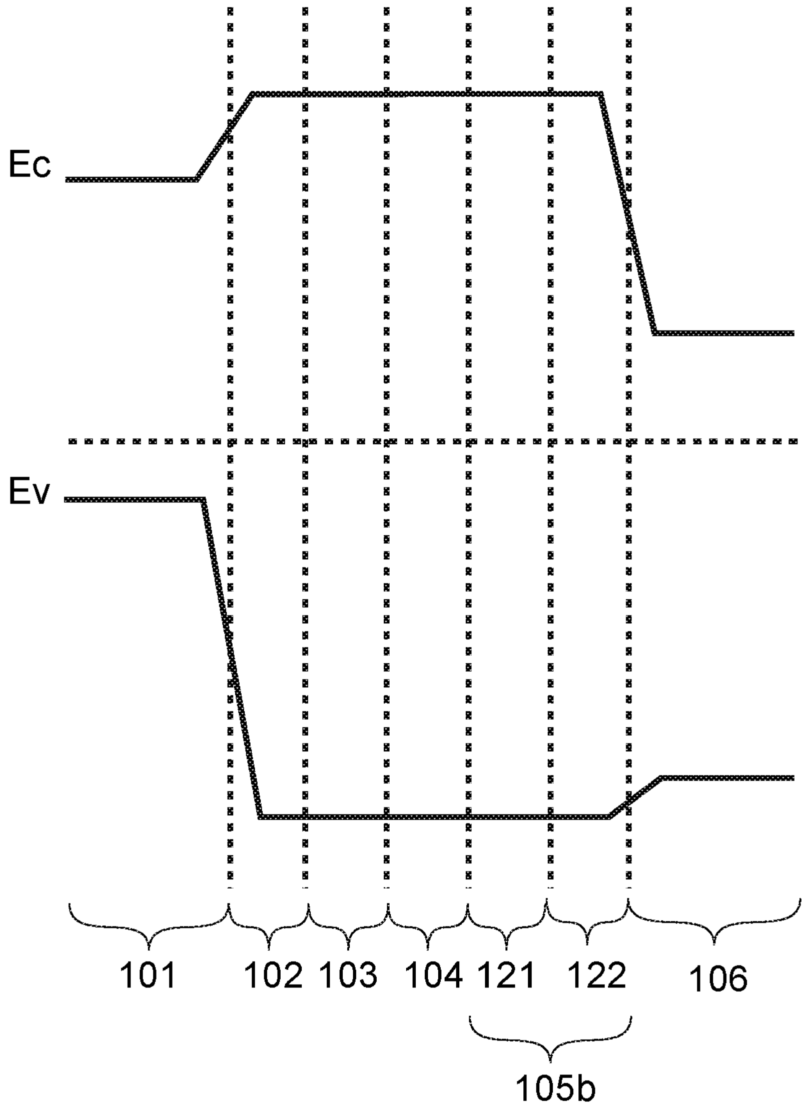
FIG. 26 is a band diagram showing a band structure of an outer peripheral region in the disposition example 2 of the VCSEL device.

FIG. 26 is a band diagram showing a band structure along the line B-B of the VCSEL device 100 shown in FIG. 23. Note that the band structure along the line A-A of the VCSEL device 100 shown in FIG. 23 is the same as that in FIG. 8.

As shown in FIG. 26, in the outer peripheral region 105*b* of the tunnel junction layer 105, the carrier concentration decreases due to ion implantation and a tunnel junction disappears due to the increase in bandgap. Further, in the outer peripheral region of each of the upper intermediate layer 104, the active layer 103, and the lower intermediate layer 102, the bandgap increases similarly to the outer peripheral region 105*b*. For this reason, also in the configuration shown in FIG. 23, a current confinement structure is realized by the tunnel junction layer 105.

Ions can be implanted into the outer peripheral region of each of the tunnel junction layer 105, the upper intermediate layer 104, the active layer 103, and the lower intermediate layer 102 by providing a resist on the inner peripheral region 120*a* and applying ions thereto from above (see FIG. 13). At this time, by setting the depth of the ion implantation to just before the lower spacer layer 101, ions can be implanted into the outer peripheral region of the respective layers.

Note that in the case where the tunnel junction layer 105, the upper intermediate layer 104, the active layer 103, and the lower intermediate layer 102 are each formed of a substance containing Al, it is possible to form an Al oxide in the outer peripheral region of the respective layers by implanting O ions into the outer peripheral region of the respective layers. As a result, since the refractive index of the outer peripheral region of the respective layers can be made smaller than the refractive index of the inner peripheral region of the respective layers, it is possible to achieve light confinement by the tunnel junction layer 105, the upper intermediate layer 104, the active layer 103, and the lower intermediate layer 102.

Specifically, the tunnel junction layer 105 can be formed of $n^+$-AlInAs and $p^+$-AlInAs and the upper intermediate layer 104 can be formed of p-AlGaInAs. Further, the active layer 103 can be formed of AlGaInAs and the lower intermediate layer 102 can be formed of n-AlGaInAs. As a result, it is possible to form an Al oxide in the outer peripheral region of each of the tunnel junction layer 105, the upper intermediate layer 104, the active layer 103, and the lower intermediate layer 102.

Note that the lower intermediate layer 102 may be formed of a substance containing no Al, such as n-InP. In this case, it is possible to form an Al oxide only in the outer peripheral region of each of the tunnel junction layer 105, the upper intermediate layer 104, and the active layer 103.

(Ion Implantation Region 3)

As shown in FIG. 24, in the VCSEL device 100, ions may be implanted into the active layer 103 in addition to the tunnel junction layer 105. In the active layer 103, ions may be implanted into the outer peripheral region 103*b* (see FIG. 4) and no ions may be implanted into the inner peripheral region 103*a*. Further, no ions may be implanted into the upper intermediate layer 104 between the tunnel junction layer 105 and the active layer 103.

Figure 27:
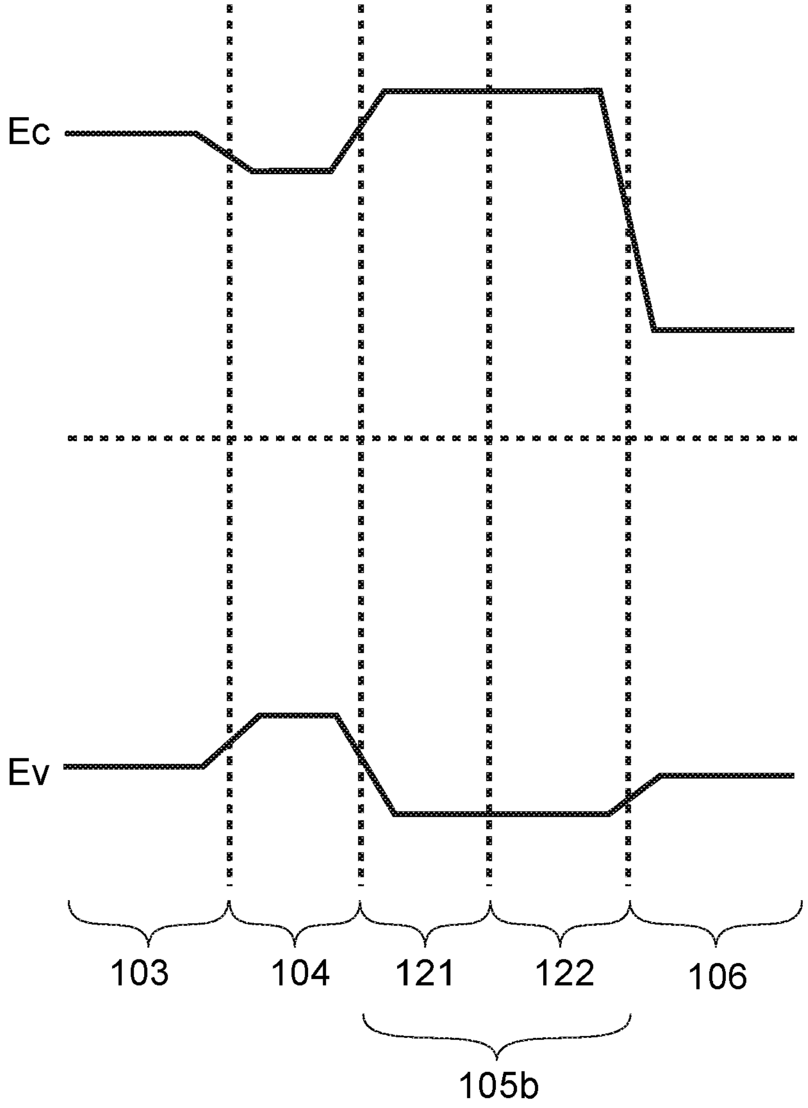
FIG. 27 is a band diagram showing a band structure of an outer peripheral region I the disposition example 3 of the VCSEL device.

FIG. 27 is a band diagram showing a band structure along the line B-B of the VCSEL device 100 shown in FIG. 24. Note that the band structure along the line A-A of the VCSEL device 100 shown in FIG. 24 is the same as that in FIG. 8.

As shown in FIG. 27, in the outer peripheral region 105*b* of the tunnel junction layer 105, the carrier concentration decreases due to ion implantation and a tunnel junction disappears due to the increase in bandgap. Further, in the outer peripheral region 103*b* of the active layer 103, the bandgap increases similarly to the outer peripheral region 105*b*. Meanwhile, since ions have not been implanted into the outer peripheral region 104*b* of the upper intermediate layer 104, the bandgap is maintained.

Ions can be implanted into the outer peripheral region of each of the tunnel junction layer 105 and the active layer 103 by providing a resist on the inner peripheral region 120*a* and applying ions thereto from above (see FIG. 13). Here, by forming each of the tunnel junction layer 105 and the active layer 103 of a substance containing Al and the upper intermediate layer 104 of a substance containing no Al and using O ions as ions to be implanted, it is possible to implant ions only in the outer peripheral region of each of the tunnel junction layer 105 and the active layer 103.

Further, by increasing the amount of O ions to be implanted, it is possible to form an Al oxide in the outer peripheral region of each of the tunnel junction layer 105 and the active layer 103. As a result, since the refractive index of the outer peripheral region of each of the tunnel junction layer 105 and the active layer 103 can be made smaller than the refractive index of the inner peripheral region of the respective layers, it is possible to achieve light confinement by the tunnel junction layer 105 and the active layer 103.

Specifically, the tunnel junction layer 105 can be formed of $n^+$-AlInAs and $p^+$-AlInAs and the active layer 103 can be formed of AlGaInAs. Further, the upper intermediate layer 104 can be formed of p-InP. As a result, it is possible to form an Al oxide in the outer peripheral region of each of the tunnel junction layer 105 and the active layer 103 and form no Al oxide in the upper intermediate layer 104.

Note that the lower intermediate layer 102 may be formed of a substance containing Al, such as n-AlGaInAs, and may be formed of a substance containing no Al, such as n-InP. In the case where the lower intermediate layer 102 is formed of a substance containing Al, it is possible to form an Al oxide in the outer peripheral region of each of the tunnel junction layer 105, the active layer 103, and the lower intermediate layer 102.

In addition, in the VCSEL device 100, ions may be implanted into the outer peripheral region of at least one of the lower intermediate layer 102, the active layer 103, or the upper intermediate layer 104. Further, in the VCSEL device 100, the outer peripheral region of at least one of the lower intermediate layer 102, the active layer 103, or the upper intermediate layer 104 may contain an Al oxide.

[Other Structures of VCSEL Device]

Other structures of the VCSEL device 100 will be described. FIG. 28 to FIG. 31 are each a cross-sectional view of the VCSEL device 100 having another structure. Note that in each VCSEL device 100 shown below, the disposition of the ion implantation region R may have any of the above-mentioned configurations.

(Lower DBR)

Figure 28:
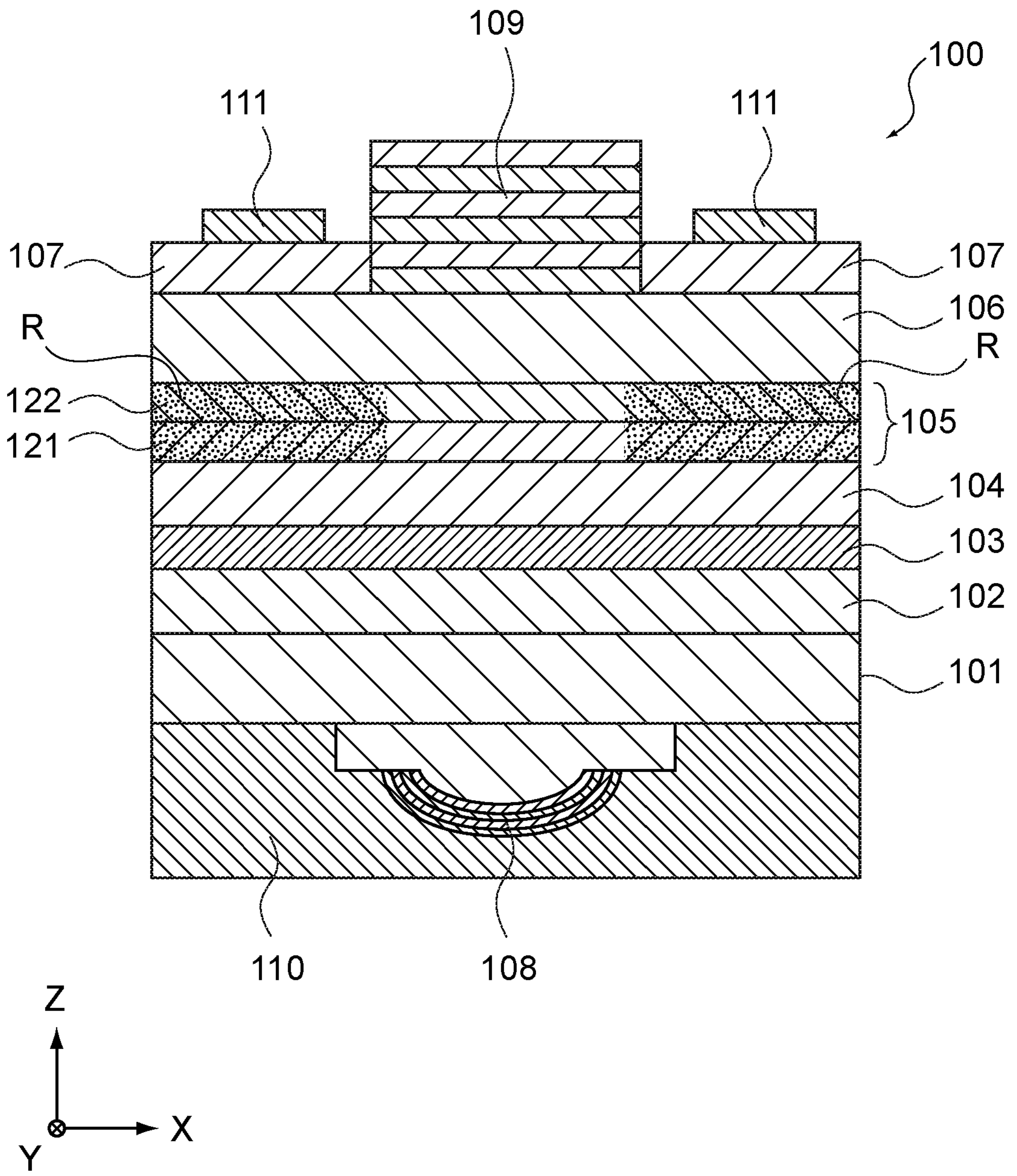
FIG. 28 is a cross-sectional view of a VCSEL device having another structure according to an embodiment of the present technology.

As shown in FIG. 28, the VCSEL device 100 may include the lower DBR 108 having a recessed curved surface shape. As shown in the figure, the VCSEL device 100 further includes a support layer 112 formed on the lower spacer layer 101. The support layer 112 is formed of a semi-insulating material such as SI (semi-insulate)-InP and is formed in a projecting curved surface shape.

The lower DBR 108 is formed on the support layer 112 and is formed in a recessed curved surface shape. By forming the lower DBR 108 in a recessed curved surface shape, it is possible to collect reflected light from the lower DBR 108 on the inner peripheral region 120*a* and achieve a light confinement effect by the lower DBR 108. Note that the lower DBR 108 may have a spherical curved surface shape and may have a cylindrical curved surface shape or another curved surface shape.

(Back Surface Emitting VCSEL)

Figure 29:
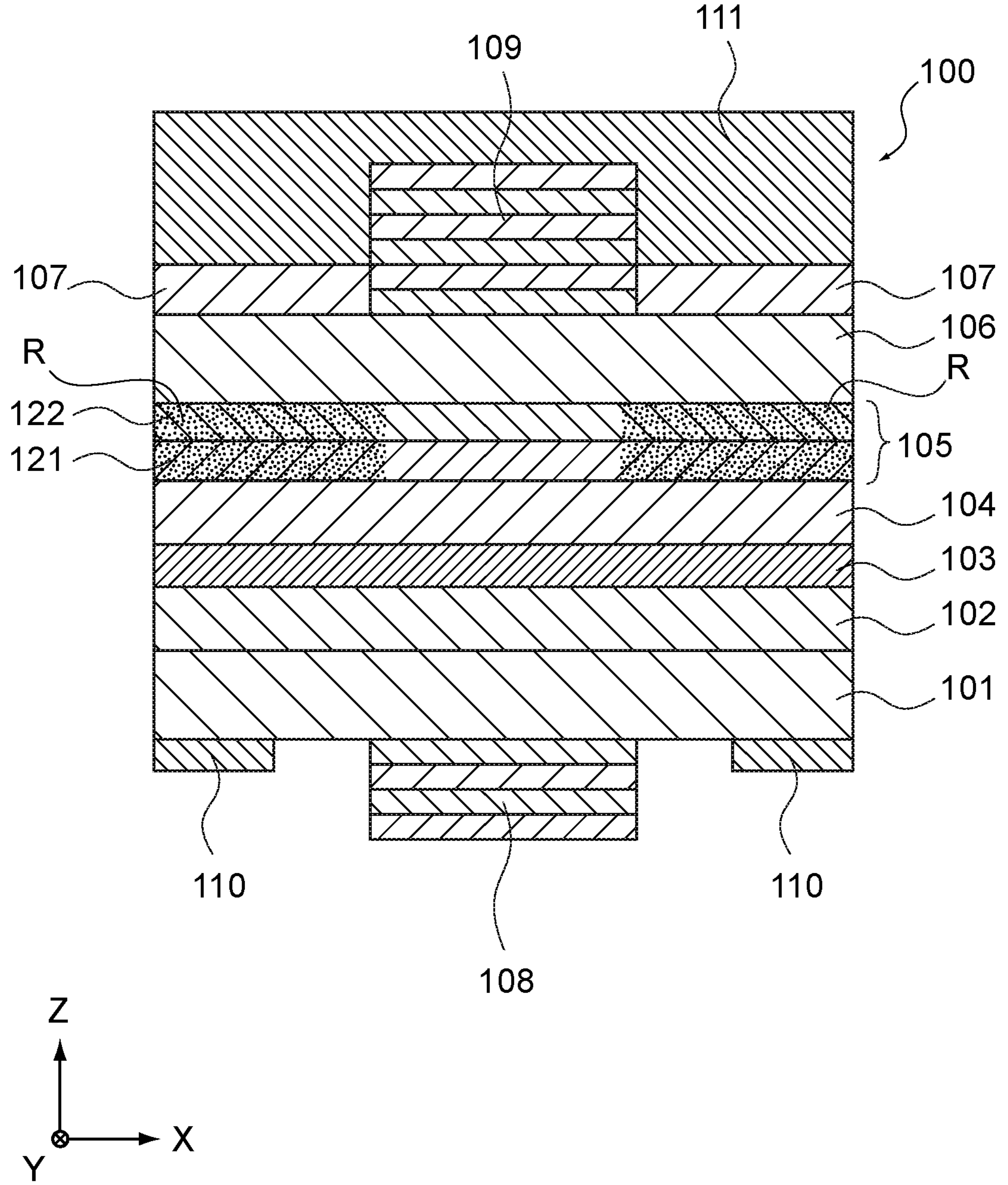
FIG. 29 is a cross-sectional view of a VCSEL device having another structure according to an embodiment of the present technology.

As shown in FIG. 29, the VCSEL device 100 may be a back surface emitting VCSEL. In this structure, the upper electrode 111 covers the upper DBR 109 and the lower electrode 110 is provided around the lower DBR 108. The laser beam generated in the VCSEL device 100 is transmitted through the lower DBR 108 and is emitted from the back surface side (on the side of the lower spacer layer 101). Note that the upper DBR 109 may have the above-mentioned recessed curved surface shape.

(Disposition of Tunnel Junction Layer)

Figure 30:
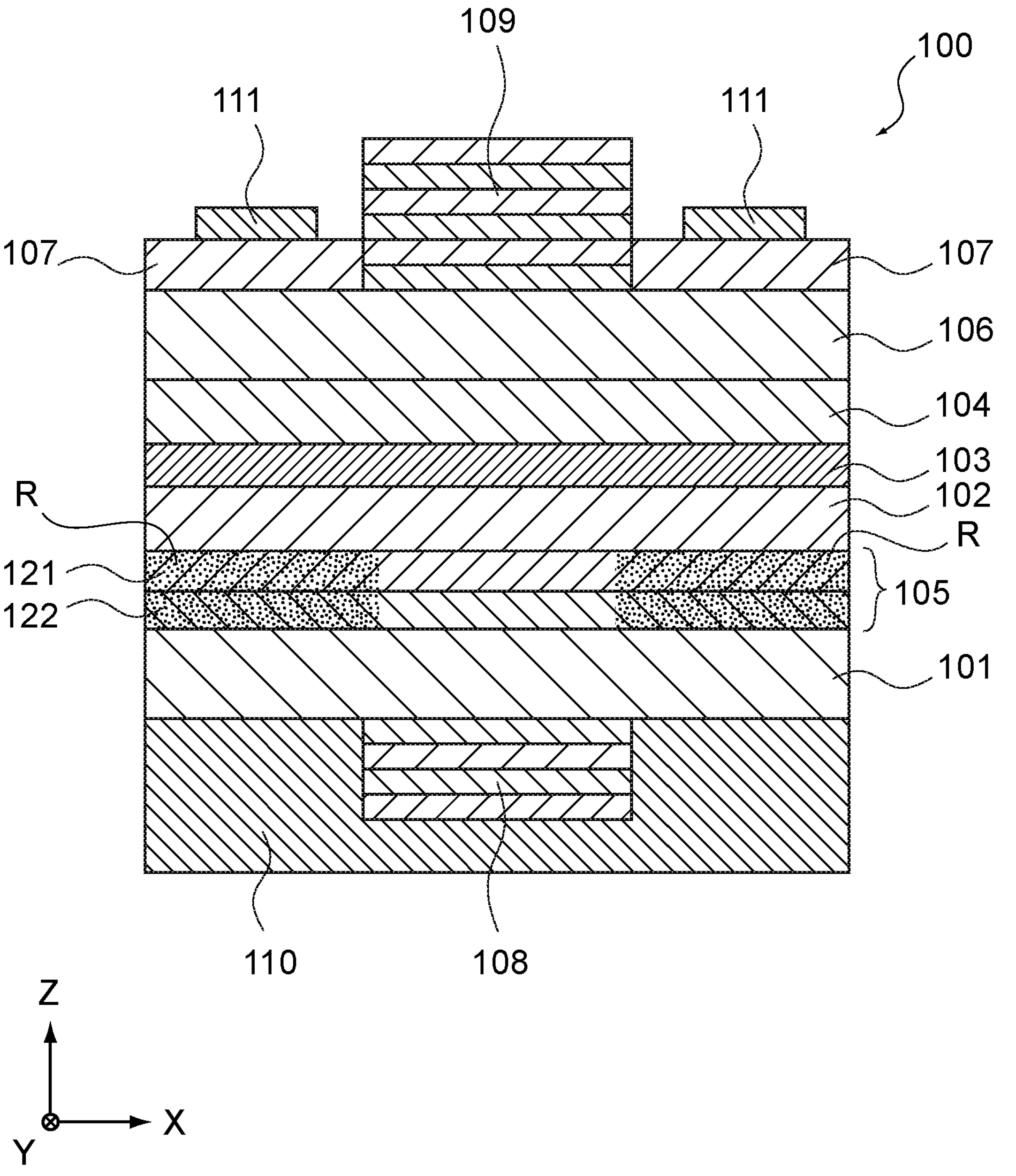
FIG. 30 is a cross-sectional view of a VCSEL device having another structure according to an embodiment of the present technology.

As shown in FIG. 30, in the VCSEL device 100, the tunnel junction layer 105 may be provided closer to the lower DBR 108 than the active layer 103. That is, the VCSEL device 100 may be obtained by stacking the lower spacer layer 101, the tunnel junction layer 105, the lower intermediate layer 102, the active layer 103, the upper intermediate layer 104, and the upper spacer layer 106 in this order.

In this structure, the lower intermediate layer 102 can be formed of a p-type semiconductor material such as p-AlGaInAs and the upper intermediate layer 104 can be formed of an n-type semiconductor material such as n-AlGaInAs. The other layers can be formed of the materials described above. Note that in this structure, the VCSEL device 100 can be a back surface emitting VCSEL and the lower DBR 108 or the upper DBR 109 can have a recessed curved surface shape.

(Different Material Substrate)

Figure 31:
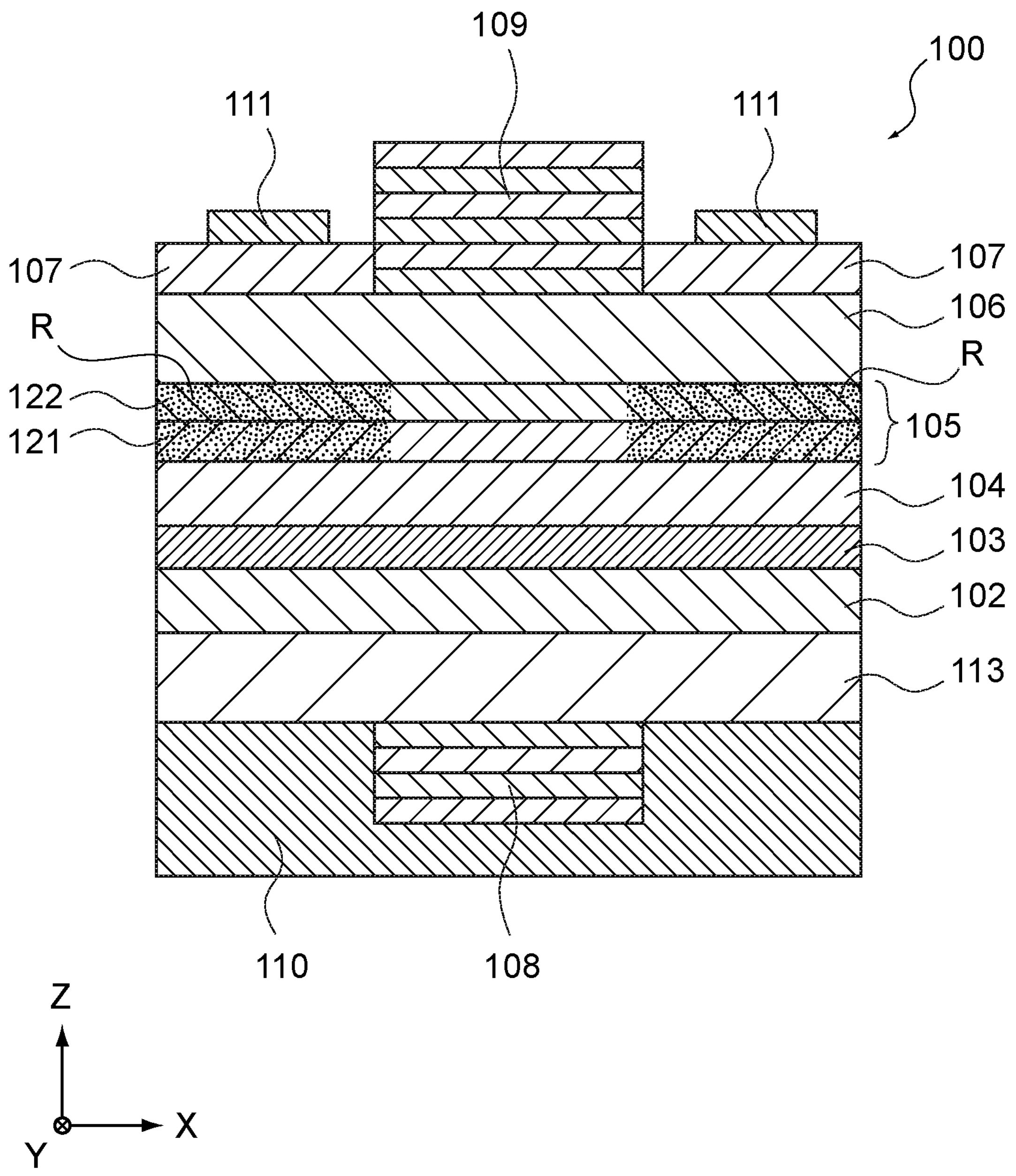
FIG. 31 is a cross-sectional view of a VCSEL device having another structure according to an embodiment of the present technology.

As shown in FIG. 31, the VCSEL device 100 may include a substrate 113 instead of the lower spacer layer 101. The substrate 113 is formed of a material different from those of the other layers of the VCSEL device 100, such as Si, SiC, AlN, GaN, and glass, and can be attached to the lower intermediate layer 102. The substrate 113 is suitably formed of a material having high thermal conductivity.

(Materials of Respective Layers)

As described above, the VCSEL device 100 can be an InP-based VCSEL device obtained by stacking respectively layers by crystal growth on the substrate 131 (see FIG. 10) formed of n-InP. Alternatively, the VCSEL device 100 may be a GaAs-based VCSEL device obtained by stacking respective layers by crystal growth on a substrate formed of n-GaAs.

In this case, the lower spacer layer 101 and the upper spacer layer 106 (see FIG. 1) can be formed of n-GaAs and the lower intermediate layer 102 can be formed of n-AlGaAs. Further, the active layer 103 can be formed of InGaAs, GaInNAs, or the like and the upper intermediate layer 104 can be formed of p-AlGaAs. In the tunnel junction layer 105, the first layer 121 can be formed of $p^+$-AlGaAs and the second layer 122 can be formed of $n^+$-AlGaAs in the inner peripheral region 105*a* and the outer peripheral region 105*b* can be formed of an AlGaAs oxide. The contact layer 107 can be formed of $n^+$-GaAs. In addition, the VCSEL device 100 can be formed of various materials capable of realizing a VCSEL device.

[VCSEL Device Array]

Figure 32:
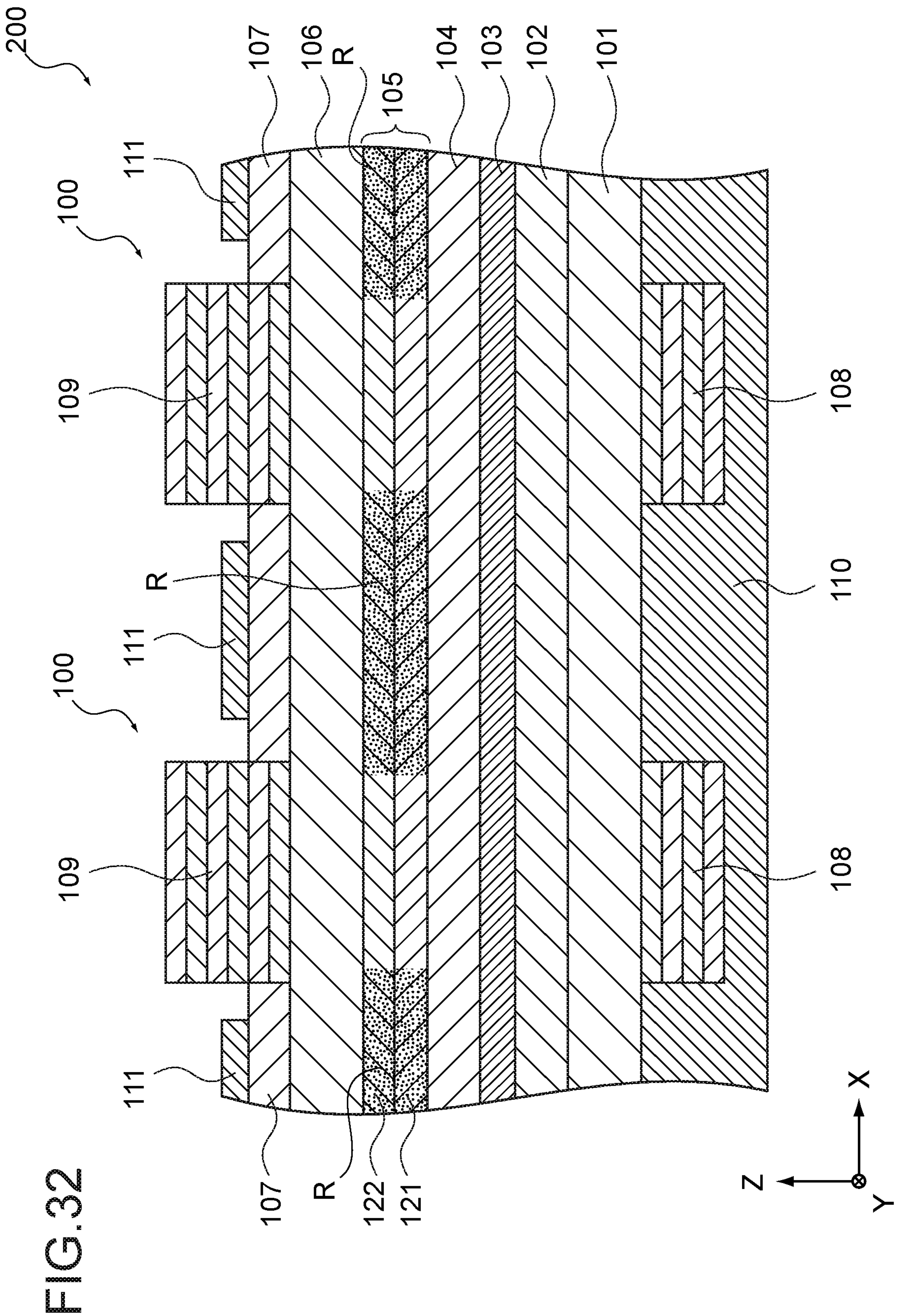
FIG. 32 is a cross-sectional view of a VCSEL device array according to an embodiment of the present technology.

The VCSEL device 100 according to this embodiment is also capable of constituting a VCSEL device array. FIG. 32 is a cross-sectional view of a VCSEL device array 200 according to this embodiment. As shown in the figure, the VCSEL device array 200 is configured by arranging a plurality of the VCSEL devices 100. The number of VCSEL devices 100 constituting the VCSEL device array 200 is not particularly limited.

Figure 33:
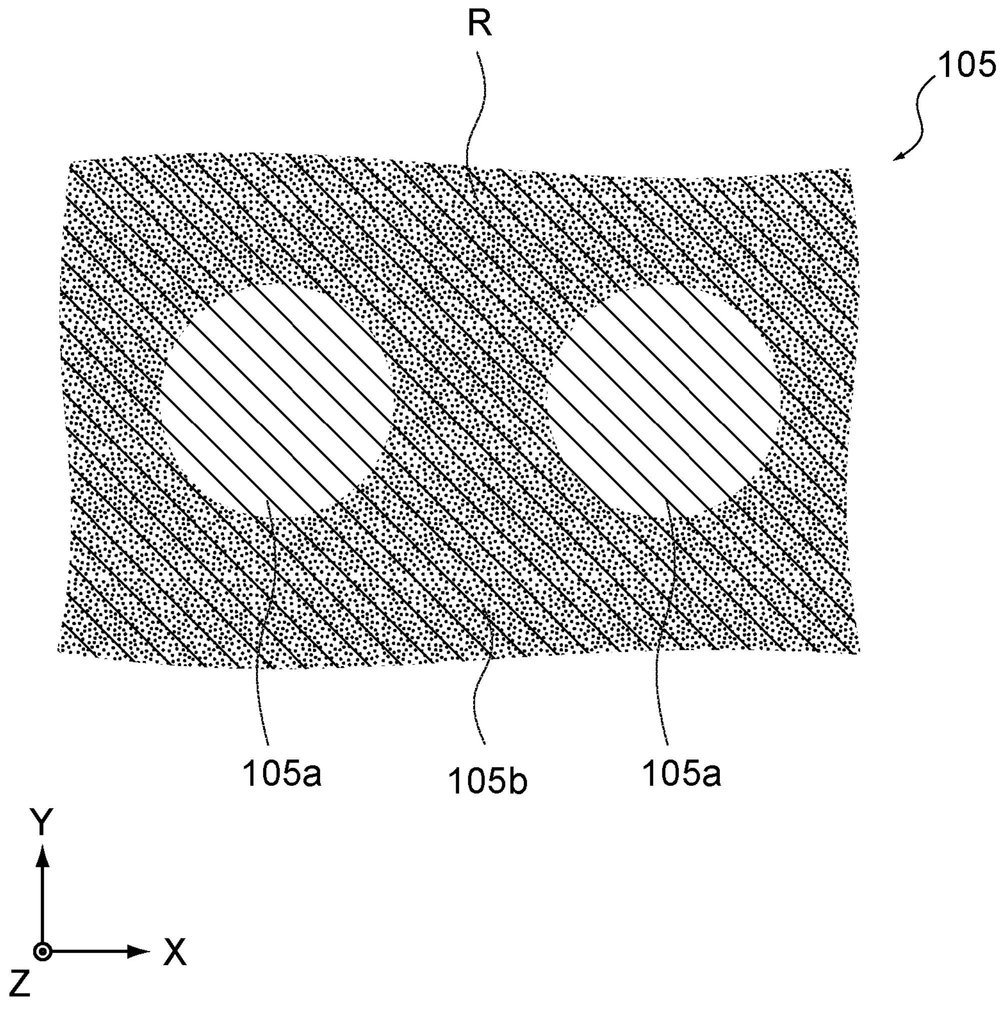
FIG. 33 is a plan view of a tunnel junction layer included in the VCSEL device array.

FIG. 33 is a plan view showing the tunnel junction layer 105 in the VCSEL device array 200. As shown in the figure, the tunnel junction layer 105 includes a plurality of the inner peripheral regions 105*a* and the outer peripheral region 105*b* surrounding the inner peripheral regions 105*a*. The ion implantation region R is formed in the outer peripheral region 105*b* and a current confinement structure is realized by the tunnel junction layer 105.

[Integrated Module]

Figure 34:
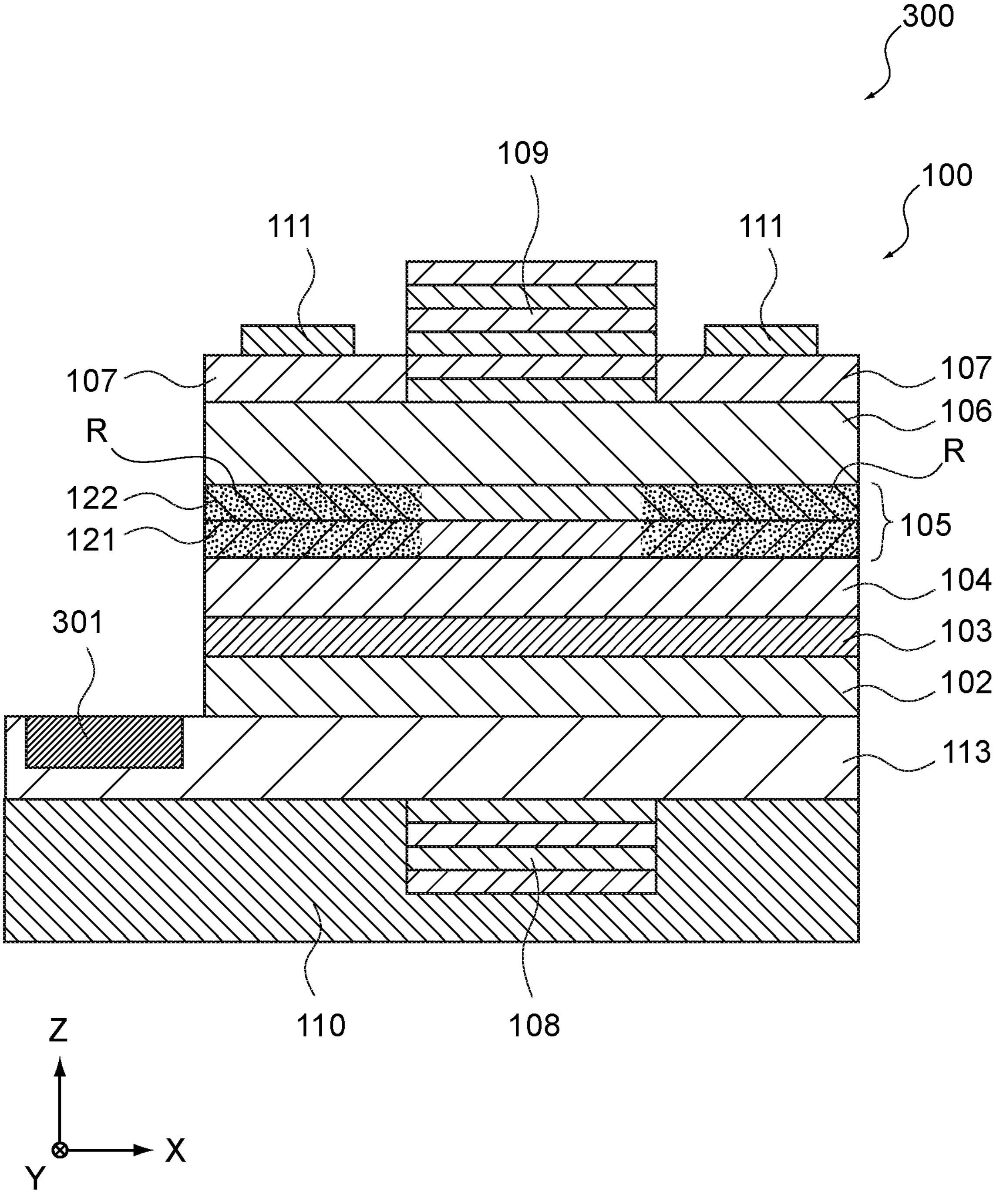
FIG. 34 is a cross-sectional view of an integrated module according to an embodiment of the present technology.

The VCSEL device 100 according to this embodiment is also capable of constituting an integrated module. FIG. 34 is a cross-sectional view of an integrated module 300 according to this embodiment. As shown in the figure, the integrated module 300 includes the VCSEL device 100 and a semiconductor device 301.

The VCSEL device 100 includes the above-mentioned substrate 113 (see FIG. 31) and the substrate 113 is capable of constituting a semiconductor circuit such as a Si circuit. The semiconductor device 301 is mounted on the substrate 113 and is electrically connected to the VCSEL device 100 via the semiconductor circuit in the substrate 113. The semiconductor device 301 is a light-receiving device and can be, for example, an APD (avalanche photodiode) formed of SiGe. As a result, the integrated module 300 is capable of constituting a TOF (Time-of-Flight) module.

Further, the semiconductor device 301 may be a device other than a light-receiving device and may be, for example, a drive device of a VCSEL device. Further, one or a plurality of the semiconductor devices 301 may be mounted on the above-mentioned VCSEL device array 200 to obtain an integrated module. The semiconductor device 301 can be mounted by a silicon photonics technology. The integrated module 300 does not necessarily need to include the semiconductor device 301 and may include a semiconductor circuit formed in the substrate 113 and one or a plurality of the VCSEL devices 100.

[Regarding Present Disclosure]

The effects described in the present disclosure are merely examples and not limited, and additional effects may be provided. The above description of the plurality of effects does not necessarily mean that these effects are simultaneously exhibited. It means that at least one of the effects described above can be achieved, and effects not described in the present disclosure may be exhibited. Further, of the features described in the present disclosure, at least two features may be combined.

It should be noted that the present technology may also take the following configurations.

(1) A vertical cavity surface emitting laser element, including a first DBR (Distributed Bragg Reflector) that reflects light of a specific wavelength;

a second DBR that reflects light of the wavelength;

an active layer that is disposed between the first DBR and the second DBR;

a tunnel junction layer that is disposed between the first DBR and the active layer and forms a tunnel junction, in which respective layers between the first DBR and the second DBR have an inner peripheral region that is on an inner peripheral side as viewed from a direction perpendicular to a layer surface, and an outer peripheral region surrounding the inner peripheral region, ions being implanted into the outer peripheral region of the tunnel junction layer, the outer peripheral region having a lower carrier concentration and a larger electric resistance than the inner peripheral region of the tunnel junction layer.

(2) The vertical cavity surface emitting laser element according to (1) above, in which a bandgap of the outer peripheral region of the tunnel junction layer is larger than a bandgap of the inner peripheral region of the tunnel junction layer.

(3) The vertical cavity surface emitting laser element according to (2) above, in which a refractive index of the outer peripheral region of the tunnel junction layer is smaller than a refractive index of the inner peripheral region of the tunnel junction layer.

(4) The vertical cavity surface emitting laser element according to any one of (1) to (3) above, in which the ions are O ions.

(5) The vertical cavity surface emitting laser element according to any one of (1) to (4) above, in which the tunnel junction layer is formed of a substance containing at least one layer of Al.

(6) The vertical cavity surface emitting laser element according to (5) above, in which the outer peripheral region of the tunnel junction layer contains an Al oxide.

(7) The vertical cavity surface emitting laser element according to any one of (1) to (6) above, further including:

a first intermediate layer that is disposed between the tunnel junction layer and the active layer; and a second intermediate layer that is disposed between the second DBR and the active layer, in which the ions are O ions, and the outer peripheral region of at least one of the active layer, the first intermediate layer, or the second intermediate layer contains an Al oxide.

(8) The vertical cavity surface emitting laser element according to (7) above, in which the outer peripheral region of the first intermediate layer contains an Al oxide, and the outer peripheral region of each of the active layer and the second intermediate layer contains no Al oxide.

(9) The vertical cavity surface emitting laser element according to (7) above, in which the outer peripheral region of each of the first intermediate layer, the active layer, and the second intermediate layer contains an Al oxide.

(10) The vertical cavity surface emitting laser element according to (7) above, in which the outer peripheral region of the active layer contains an Al oxide, and the outer peripheral region of each of the first intermediate layer and the second intermediate layer contains no Al oxide.

(11) The vertical cavity surface emitting laser element according to any one of (1) to (10) above, in which the inner peripheral region of the tunnel junction layer is formed by stacking a first layer formed of $p^+$-AlInAs and a second layer formed of $n^+$-AlInAs, and the outer peripheral region of the tunnel junction layer is formed of an AlInAs oxide.

(12) The vertical cavity surface emitting laser element according to any one of (1) to (10) above, in which the inner peripheral region of the tunnel junction layer is formed by stacking a first layer formed of $p^+$-AlGaAs and a second layer formed of $n^+$-AlGaAs, and the outer peripheral region of the tunnel junction layer is formed of an AlGaAs oxide.

(13) A method of producing a vertical cavity surface emitting laser element, including:

forming a stacked body that includes a first DBR (Distributed Bragg Reflector) that reflects light of a specific wavelength, a second DBR that reflects light of the wavelength, an active layer that is disposed between the first DBR and the second DBR, and a tunnel junction layer that is disposed between the first DBR and the active layer and forms a tunnel junction, respective layers between the first DBR and the second DBR having an inner peripheral region that is on an inner peripheral side as viewed from a direction perpendicular to a layer surface, and an outer peripheral region surrounding the inner peripheral region; and implanting ions into the outer peripheral region of the tunnel junction layer to make a carrier concentration of the outer peripheral region of the tunnel junction layer lower than a carrier concentration of the inner peripheral region of the tunnel junction layer and make an electric resistance of the outer peripheral region of the tunnel junction layer larger than an electric resistance of the inner peripheral region of the tunnel junction layer.

(14) The method of producing a vertical cavity surface emitting laser element according to (13) above, in which the tunnel junction layer is formed of a substance containing Al, and the step of implanting ions into the outer peripheral region of the tunnel junction layer includes implanting O ions into the outer peripheral region of the tunnel junction layer.

(15) The method of producing a vertical cavity surface emitting laser element according to (14) above, in which the step of implanting ions into the outer peripheral region of the tunnel junction layer further includes generating an Al oxide in the outer peripheral region of the tunnel junction layer by implanting O ions.

(16) The method of producing a vertical cavity surface emitting laser element according to (14) above, in which the stacked body further includes a first intermediate layer that is disposed between the tunnel junction layer and the active layer, and a second intermediate layer that is disposed between the second DBR and the active layer, and the step of implanting ions into the outer peripheral region of the tunnel junction layer further includes implanting O ions into the outer peripheral region of at least one of the active layer, the first intermediate layer, or the second intermediate layer.

(17) The method of producing a vertical cavity surface emitting laser element according to any one of (14) to (16) above, further including an annealing step of repairing crystal defects caused by the ion implantation and promoting generation of an Al oxide.

REFERENCE SIGNS LIST

100 VCSEL device
101 lower spacer layer

102 lower intermediate layer
103 active layer
104 upper intermediate layer
105 tunnel junction layer
105*a* inner peripheral region
105*b* outer peripheral region
106 upper spacer layer
107 contact layer
108 lower DBR
109 upper DBR
110 lower electrode
111 upper electrode

The invention claimed is:

1. A vertical cavity surface emitting laser element, comprising:

a stacked body that comprises:

a first DBR (Distributed Bragg Reflector) configured to reflect light of a specific wavelength;

a second DBR configured to reflect the light of the specific wavelength;

an active layer between the first DBR and the second DBR; and a tunnel junction layer between the first DBR and the active layer, wherein the tunnel junction layer includes a tunnel junction, each of the active layer and the tunnel junction layer includes an inner peripheral region and an outer peripheral region, a bandgap of the outer peripheral region of the tunnel junction layer is larger than a bandgap of the inner peripheral region of the tunnel junction layer, each of the inner peripheral region and the outer peripheral region is in a direction which is perpendicular to a layer surface direction of the stacked body, the outer peripheral region surrounds the inner peripheral region, ions are implanted into the outer peripheral region of the tunnel junction layer, the outer peripheral region of the tunnel junction layer has a carrier concentration lower than a carrier concentration of the inner peripheral region of the tunnel junction layer, and the outer peripheral region of the tunnel junction layer has an electric resistance larger than an electric resistance of the inner peripheral region of the tunnel junction layer.

2. The vertical cavity surface emitting laser element according to claim 1, wherein a refractive index of the outer peripheral region of the tunnel junction layer is smaller than a refractive index of the inner peripheral region of the tunnel junction layer.

3. The vertical cavity surface emitting laser element according to claim 2, wherein the ions are O ions.

4. The vertical cavity surface emitting laser element according to claim 3, wherein the tunnel junction layer includes a substance that contains at least one layer of Al.

5. The vertical cavity surface emitting laser element according to claim 4, wherein the outer peripheral region of the tunnel junction layer contains an Al oxide.

6. The vertical cavity surface emitting laser element according to claim 1, further comprising:

a first intermediate layer between the tunnel junction layer and the active layer; and a second intermediate layer between the second DBR and the active layer, wherein each of the first intermediate layer and the second intermediate layer includes an outer peripheral region, the ions are O ions, and the outer peripheral region of at least one of the active layer, the first intermediate layer, or the second intermediate layer contains an Al oxide.

7. The vertical cavity surface emitting laser element according to claim 6, wherein the outer peripheral region of the first intermediate layer contains the Al oxide, and the outer peripheral region of each of the active layer and the second intermediate layer contains no Al oxide.

8. The vertical cavity surface emitting laser element according to claim 6, wherein the outer peripheral region of each of the first intermediate layer, the active layer, and the second intermediate layer contains the Al oxide.

9. The vertical cavity surface emitting laser element according to claim 6, wherein the outer peripheral region of the active layer contains the Al oxide, and the outer peripheral region of each of the first intermediate layer and the second intermediate layer contains no Al oxide.

10. The vertical cavity surface emitting laser element according to claim 1, wherein the inner peripheral region of the tunnel junction layer includes a first layer of $p^+$-AlInAs and a second layer of $n^+$-AlInAs, and the outer peripheral region of the tunnel junction layer includes an AlInAs oxide.

11. The vertical cavity surface emitting laser element according to claim 1, wherein the inner peripheral region of the tunnel junction layer includes a first layer of $p^+$-AlGaAs and a second layer of $n^+$-AlGaAs, and the outer peripheral region of the tunnel junction layer includes an AlGaAs oxide.

12. A method of producing a vertical cavity surface emitting laser element, the method comprising:

forming a stacked body that includes:

a first DBR (Distributed Bragg Reflector) configured to reflect light of a specific wavelength, a second DBR configured to reflect the light of the specific wavelength, an active layer between the first DBR and the second DBR, and a tunnel junction layer between the first DBR and the active layer, wherein the tunnel junction layer includes a tunnel junction, each of the active layer and the tunnel junction layer includes: an inner peripheral region and an outer peripheral region, a bandgap of the outer peripheral region of the tunnel junction layer is larger than a bandgap of the inner peripheral region of the tunnel junction layer, each of the inner peripheral region and the outer peripheral region is in a direction which is perpendicular to a layer surface direction of the stacked body, and the outer peripheral region surrounds the inner peripheral region; and implanting ions into the outer peripheral region of the tunnel junction layer, wherein a carrier concentration of the outer peripheral region of the tunnel junction layer is lower than a carrier concentration of the inner peripheral region of the tunnel junction layer, based on the implantation of the ions into the outer peripheral region of the tunnel junction layer, and an electric resistance of the outer peripheral region of the tunnel junction layer is larger than an electric resistance of the inner peripheral region of the tunnel junction layer, based on the implantation of the ions into the outer peripheral region of the tunnel junction layer.

13. The method according to claim 12, wherein the tunnel junction layer includes a substance containing Al, and the implanting of the ions into the outer peripheral region of the tunnel junction layer includes implanting O ions into the outer peripheral region of the tunnel junction layer.

14. The method according to claim 13, wherein the implanting of the O ions into the outer peripheral region of the tunnel junction layer further includes generating an Al oxide in the outer peripheral region of the tunnel junction layer.

15. The method according to claim 13, wherein the stacked body further includes:

a first intermediate layer between the tunnel junction layer and the active layer, and a second intermediate layer between the second DBR and the active layer, each of the first intermediate layer and the second intermediate layer includes an outer peripheral region, and the implanting of the ions into the outer peripheral region of the tunnel junction layer further includes implanting of the O ions into the outer peripheral region of at least one of the active layer, the first intermediate layer, or the second intermediate layer.

16. The method according to claim 13, further comprising an annealing treatment that includes:

repairing crystal defects caused by the implantation of the ions; and promoting generation of an Al oxide.

* * * * *